United States Patent
Klein et al.

(10) Patent No.: US 7,602,320 B2
(45) Date of Patent: Oct. 13, 2009

(54) SYSTEMS AND METHODS FOR COMPANDING ADC-DSP-DAC COMBINATIONS

(75) Inventors: Ari Klein, Flushing, NY (US); Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/901,661

(22) Filed: Sep. 18, 2007

(65) Prior Publication Data

US 2008/0198048 A1 Aug. 21, 2008

Related U.S. Application Data

(63) Continuation-in-part of application No. PCT/US2006/010204, filed on Mar. 20, 2006.

(60) Provisional application No. 60/663,056, filed on Mar. 18, 2005, provisional application No. 60/782,213, filed on Oct. 19, 2005.

(51) Int. Cl.
  *H03M 1/00* (2006.01)
(52) U.S. Cl. .................. 341/110; 341/144; 341/155
(58) Field of Classification Search ............. 341/144, 341/155, 143, 110, 106
  See application file for complete search history.

(56) References Cited

U.S. PATENT DOCUMENTS

| | | | |
|---|---|---|---|
| 3,350,512 A * | 10/1967 | Percival et al. ............. 360/24 |
| 3,934,190 A | 1/1976 | Dolby et al. |
| 4,430,626 A | 2/1984 | Adams |
| 4,713,662 A * | 12/1987 | Wiegand ..................... 342/13 |
| 4,785,418 A | 11/1988 | Pearce et al. |
| 5,469,508 A * | 11/1995 | Vallier .......................... 381/63 |
| 5,729,182 A * | 3/1998 | Fousset et al. .............. 332/100 |
| 5,757,932 A | 5/1998 | Lindemann et al. |
| 5,794,187 A * | 8/1998 | Franklin et al. ............ 704/225 |
| 5,808,574 A | 9/1998 | Johnson et al. |
| 5,821,889 A * | 10/1998 | Miller ........................ 341/139 |
| 6,081,783 A | 6/2000 | Divine et al. |
| 6,262,623 B1 | 7/2001 | Molnar |
| 6,275,020 B1 * | 8/2001 | Nagano ................... 324/76.27 |
| 6,389,445 B1 | 5/2002 | Tsividis |
| 6,542,612 B1 | 4/2003 | Needham |
| 6,639,528 B1 * | 10/2003 | Yamazaki .................. 341/110 |
| 6,720,817 B2 | 4/2004 | El-Gamal et al. |
| 6,868,162 B1 * | 3/2005 | Jubien et al. ............... 381/107 |
| 2003/0112088 A1 | 6/2003 | Bizjak |
| 2007/0152851 A1 * | 7/2007 | Kawashima ................. 341/50 |

OTHER PUBLICATIONS

International Search Report and Written Opinion issued for International Patent Application No. PCT/US2006/010204.

(Continued)

*Primary Examiner*—Peguy JeanPierre
(74) *Attorney, Agent, or Firm*—Wilmer Cutler Pickering Hale and Dorr LLP

(57) ABSTRACT

Systems and methods for resizing a signal for use with a fixed-point DSP are provided. More specifically, a process called companding is used in conjunction with fixed-point devices to resize a signal to make use of the available range of these devices. In some embodiments, companding is used to improve the signal-to-noise and distortion ratio. Also, information loss associated with quantization and rounding errors can be reduced in some embodiments.

23 Claims, 20 Drawing Sheets

OTHER PUBLICATIONS

Tsividis, Y.P. et al., "Companding in Signal Processing," Electronics Letters, vol. 26 (1990), pp. 1331-1332.

Callias, F. et al., "A Set of Four IC's in CMOS Technology for a Programmable Hearing Aid," IEEE Journal of Solid-State Circuits, vol. 24 (1989), pp. 301-312.

Seevinck, E., "Companding Current-mode Integrator: a New Circuit Principle for Continuous-time Monolithic Filters," Electronics Letters, vol. 26 (1990), pp. 2046-2047.

Frey, D.R. "Log-domain filtering: an approach to current-mode filtering," IEEE: Proceedings-G, vol. 140 (1993), pp. 406-416.

Efthivoulidis, G. et al., "Singanl Analysis of Externally Linear Filters," in Proc. 1999 IEEE ISCAS, Jun. 1999, pp. 65-68.

Blumenkrantz, E.M. "The Analog Floating Point Technique," in Proc. 1995 IEEE Symp. Low-Power Electronics, Oct. 1999, pp. 72-73.

Tsividis, Y. et al., "Externally Linear, Time-Invariant Systems and Their Application to Companding Signal Processors," IEEE Trans. Circuits and Systems II, vol. 44, pp. 65-85, Feb. 1997.

* cited by examiner

SYSTEMS AND METHODS FOR COMPANDING ADC-DSP-DAC COMBINATIONS

CROSS-REFERENCE TO RELATED APPLICATIONS

This application is a continuation-in-part of International Patent Application No. PCT/US2006/010204, filed Mar. 20, 2006, which claims the benefit of U.S. Provisional Patent Applications Nos. 60/663,056, filed Mar. 18, 2005, and 60/782,213, filed Oct. 19, 2005, which are hereby incorporated by reference herein in their entireties.

STATEMENT REGARDING FEDERALLY-SPONSORED RESEARCH OR DEVELOPMENT

This invention was made with government support under CCR-02-0910 awarded by the National Science Foundation (NSF). The government has certain rights in the invention.

BACKGROUND

The present application relates to the use of a technique called "companding" with digital signal processing. More specifically, the present application relates to using companding to resize the dynamic range of an input signal so that the signal is better suited for processing by a digital signal processor (DSP).

There are typically two types of DSPs, floating-point DSPs and fixed-point DSPs. Generally, a floating-point DSP uses a certain number of bits to represent the mantissa of a signal's value and another set of bits to represent the exponent of the signal's value. For example, for a large signal, which may be quantified as 1126.4, which is 1.1 times $2^{10}$, a floating point representation may be 1.1 for the mantissa and 10 for the exponent. Floating-point DSPs thus provide the ability to represent a very wide range of values, but with a precision that is limited by the number of bits used to represent the mantissa.

Unlike a floating-point DSP, a fixed-point DSP uses all of its bits to represent a signal's value. The precision of the fixed-point DSP is determined by dividing its range by the number of discrete values that can be represented by the available bits in the DSP. Thus, for example, if a DSP is to process signals having a range of 0-16 and it has three available bits, which can represent eight discrete values, then the least significant bit carries a value of two. Fixed-point DSPs can experience problems, however, with signals that are not sized well to the DSP. For example, in a 21-bit fixed point system, if the least significant bit is set to 1, the DSP that can only handle signals having values up to 2,097,152, so a signal with the value of 3,676,000 will not be properly processed. As another example, if the signal's value is small (e.g., 10) and changes to the signal's value are small (e.g., +/−1.4) compared to the range of the fixed-point DSP (e.g., 2,097,152), quantization noise from rounding problems may result in a degradation of signal quality because the least significant bit is larger than, or a large portion of, the changes to the signal's value. In contrast, in a floating-point DSP, the mantissa and exponent may be used to represent decimal values so that rounding errors are minimized.

Currently, floating-point DSPs are used in applications where the range of a signal's value varies. This is because the floating-point DSPs can adjust to the change in range by using exponent bits. Nevertheless, it is often desirable to use fixed-point DSPs instead, because fixed-point DSPs typically consume less power, are cheaper, and are fabricated in less chip area compared to floating-point DSPs.

Therefore, it is desirable to provide fixed-point DSPs that can be used in applications where the range of a signal's value varies, without the problems typically associated with fixed-point DSPs, such as significant quantization noise or overflow.

SUMMARY

Systems and methods for resizing a signal for use with a fixed-point DSP are provided in certain embodiments. More specifically, a process called companding is used in conjunction with fixed-point devices to resize a signal to make use of the available range of these devices. In some embodiments companding is used to improve the signal-to-noise and distortion ratio of a signal. Also, information loss associated with quantization and rounding errors can be reduced in some embodiments.

In accordance with the present application, certain embodiments feature an input multiplier, an analog-to-digital converter (ADC), a digital signal processor (DSP), a digital-to-analog converter (DAC), an output multiplier, and a controller. The input multiplier has a first input that receives an input signal, a second input, and an output. The ADC has an input that is coupled to the output of the input multiplier, and an output. The DSP has a first input that is coupled to the output of the ADC, a second input, and an output. The DAC has an input coupled to the output of the DSP, and an output. The output multiplier has a first input coupled to the output of the DAC, a second input, and an output. And, the controller has an input that receives the input signal, a first output that is coupled to the second input of input multiplier, a second output that is coupled to the second input of output multiplier, and a third output coupled to the second input of the DSP, wherein the input signal is resized by the input multiplier.

Further in accordance with the present application, certain embodiments feature an input means, a means for providing an analog-to-digital converter (ADC), a means for providing a digital signal processor (DSP), a means for providing a digital-to-analog converter (DAC), an output means for providing a multiplier function, and a means for controlling. The input means provides a multiplier function and has a first input that receives an input signal, second input and an output. The means for providing an ADC has an input that is coupled to the output of the input multiplier, and an output. The means for providing DSP has a first input that is coupled to the output of the means for providing an ADC, a second input, and an output. The means for providing a DAC has an input coupled to the output of the means for providing a DSP, and an output. The output means provides a multiplier function and has a first input coupled to the output of the means for providing a DAC, a second input, and an output. And, the means for controlling has an input that receives the input signal, a first output that is coupled to the second input of input means, a second output that is coupled to the second input of output means, and a third output coupled the second input of the means for providing a DSP, wherein the input signal is resized by the input means.

Still further in accordance with the present application, certain embodiments feature a method for processing an analog input signal with fixed-point devices including: resizing the analog input signal based on information provided by a controller; converting the resized analog input signal to a digital signal; processing the digital signal based in part on information provided by the controller converting the processed digital signal to an analog signal; and resizing the analog signal.

Yet further in accordance with the present application, certain embodiments feature a compressor, a nonlinear digital signal processor (DSP), and an expander. The compressor has an input coupled to the input signal, and an output. The nonlinear DSP has an input that is coupled to the output of the compressor, and an output. The expander has an input coupled to the output of the DSP, wherein the input signal is resized by the compressor according to a function.

DETAILED DESCRIPTION

In certain embodiments of the present application, systems and methods for resizing a signal for use with a fixed-point DSP are provided. More specifically, a process called companding is used in conjunction with a fixed-point DSP to resize a signal. In companding, an input signal is compressed so that the dynamic range of the compressed signal is reduced compared to that of the input signal. Then, at some later point in time, the dynamic range of the compressed signal is expanded. For the purposes of the disclosed subject matter, the compression and expansion of the signal can be either positive or negative. Therefore, the compressor can act as an expander on the front end and the expander can act as a compressor on the back end. This disclosure extends the companding method disclosed in U.S. Pat. No. 6,389,445, which is hereby incorporated by reference herein in its entirety, to systems including an analog-to-digital converter (ADC), a DSP, and a digital-to-analog converter (DAC).

Figure 18:
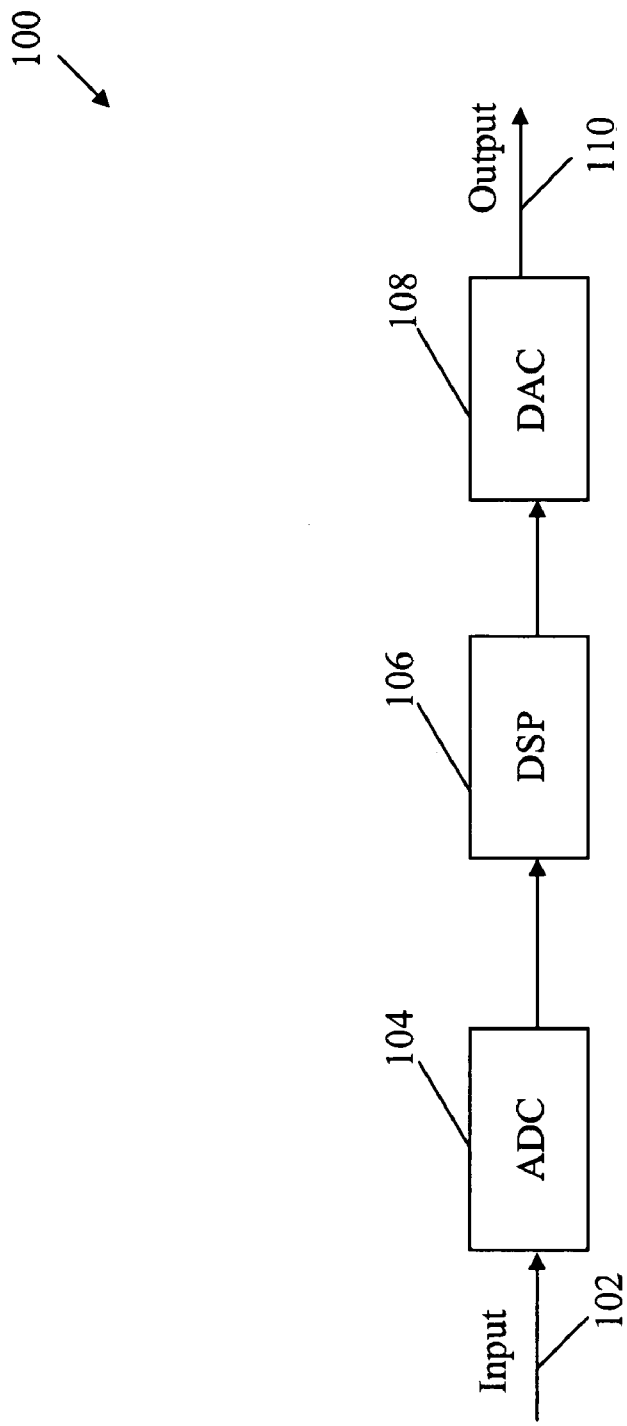
FIG. 18 is a schematic of a prior art fixed-point digital signal processing system.

FIG. 18 illustrates a prior art system 100 used in digital signal processing. System 100 includes an input 102, an ADC 104, a DSP 106, a DAC 108, and an output 110. An analog input signal may be placed on input 102 to enter ADC 104. ADC 104 converts the analog input signal into a digital signal. The digital signal is processed by DSP 106 and then that processed signal is converted back to an analog signal by DAC 108. The analog signal exits system 100 on output 110 and may be used by other devices or applications not shown in FIG. 18.

In prior art system 100, ADC 104, DSP 106, and DAC 108 have been implemented using floating-point or fixed-point devices. When floating-point devices are used throughout system 100 (so that ADC 104, DSP 106, and DAC 108 are floating-point devices) a signal is represented using mantissa bits and exponent bits, where the mantissa bits quantify the value of a signal and the exponent bits provide information on how to scale the mantissa bits. In a fixed-point configuration of system 100, all of the bits of ADC 104, DSP 106, and DAC 108 (except possibly a sign bit) are used to represent the value of a signal. Thus, if the analog input signal is larger than the maximum value of fixed-point ADC 104, information will be lost. Likewise, if the analog input signal is small compared to the maximum value of a fixed-point ADC, rounding errors may occur resulting in quantization noise and in a loss of information. In some systems, this loss of information may result in an audible degradation of sound quality, such as a hiss, where the analog input signal was music.

It may be desirable to implement system 100 with fixed-point devices, such as a fixed-point DSP 106, and with as few bits as possible in applications where large amounts of computation are needed, such as multimedia. This may be the case, for example, because fixed-point computation is typically faster than floating-point computation. Some embodiments of the disclosed subject matter use companding to provide the benefits of a fixed-point device system, while reducing the quantization noise and information loss associated with system 100.

Figure 1:
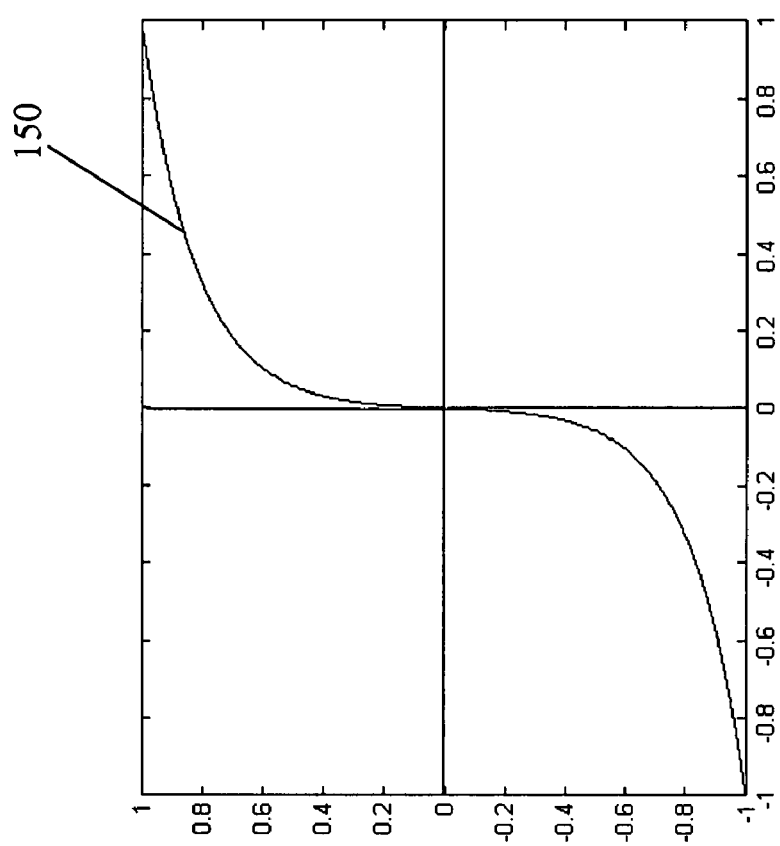
FIG. 1 is a graphic representation of a non-linear function used in accordance with certain embodiments of the disclosed subject matter.

In companding, a nonlinear function may be used to compress the dynamic range of an input signal. Other functions, such as time-invariant functions, can be used in some embodiments of the disclosed subject matter as well. An example of a typical normalized nonlinear compressing function is illustrated in FIG. 1 by line 150. Line 150 is a compressing function because, for example, all inputs between 0.25 and 1 give outputs between 0.75 and 1, so the dynamic range of the input signal is compressed. The dynamic range of the input signal may later be expanded by using the inverse of the compressing function given by line 150.

A compression function may be developed by using a compression law. There are many possible choices for the compression law. One standard logarithm-based compression law is the μ-law, which is shown below. A logarithm-based compression law benefits from the characteristic that the signal-to-noise ratio at the output is independent of the input signal's amplitude.

$$\gamma(v) = \frac{\log(1 + \mu v)}{\log(1 + \mu)}, v \geq 0$$

$$\gamma(v) = -\gamma(-v) = -\frac{\log(1 - \mu v)}{\log(1 + \mu)}, v < 0$$

Line 150 of FIG. 1 illustrates a μ-law function when μ=255. Typically, increasing μ increases the amount of compression, which tends to improve the signal-to-quantization noise ratio (SQNR) for small inputs by increasing the usable dynamic range. However, this increase in the dynamic range comes at the expense of the SQNR for large inputs or for the peak signal inputs.

Figure 2:
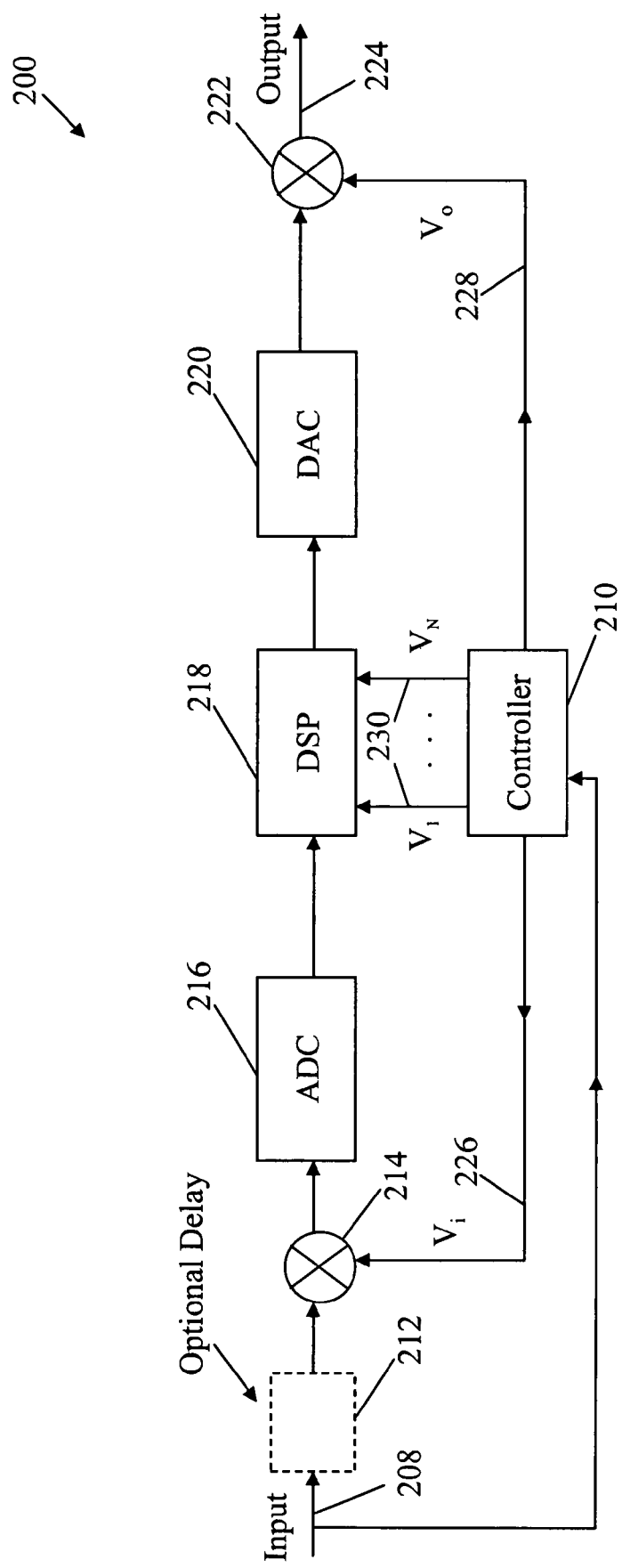
FIG. 2 is a schematic of a companding fixed-point digital signal processing system in accordance with certain embodiments of the disclosed subject matter.

FIG. 2 illustrates a companding fixed-point digital signal processing system 200 in accordance with certain embodiments of the disclosed subject matter. System 200 includes a controller 210, an optional delay circuit 212, an input multiplier 214, a fixed-point ADC 216, a fixed-point DSP 218, a fixed-point DAC 220, and an output multiplier 222. In operation, controller 210 receives an input signal and derives certain control signals $V_i$ 226, $V_o$ 228, and $V_1 \ldots V_N$ 230. Input control signal $V_i$ 226 provides information to input multiplier 214 on how to adjust the size of the input signal prior to that signal reaching ADC 216. The input signal then passes through ADC 216, which converts the input signal from analog to digital format producing a digital signal. The digital input signal is then processed by DSP 218, which generally requires control inputs $V_1 \ldots V_N$ 230, for reasons to be discussed shortly.

In some embodiments the processing may include implementing a filter, creating audio effects, and/or reducing signal noise. After processing by DSP 218, the processed signal enters DAC 220, which converts the output signal from digital to analog format. The analog output signal is then adjusted by output multiplier 222 according to information provided by output control signal $V_o$ 228. According to various embodiments of the disclosed subject matter, delay circuit 212 may be added before input multiplier 214 to delay the input signal while controller 210 calculates the control signals.

In general, input multiplier 214 either expands or compresses the dynamic range of the analog input signal before it reaches ADC 216. In some embodiments, input multiplier 214 can be implemented as a linear amplifier. Typically, input multiplier 214 may be used to reduce rounding noise by sizing input signal 208 to take advantage of the available range of ADC 216. Rounding error can occur because ADC 216, DSP 218, and DAC 220 have a specific number of quantization levels since they are fixed-point devices and a signal passing through these devices is approximated to one of these levels. If the signal is small relative to the available range of the device, then whatever difference exists between the signal and the closest quantization level will be added to or subtracted from the signal resulting in quantization or rounding error. The companding performed in this disclosed subject matter adjusts the signal so that the signal can better take advantage of the full available ranges of ADC 216, DSP 218, and DAC 220. Adjusting the signal improves signal-to-quantization noise ratio by reducing the difference between the signal and the closest quantization level, which is desirable in most applications.

Because system 200 may incorporate dynamically changing functions in DSP 218, if no control signals are provided to DSP 218, then there may be time-varying distortion that can change the correspondence or mapping of the input signal to the output signal in time. For example, time-varying distortion can arise when two multipliers are not correctly matched in time, and the expansion performed by the second multiplier does not correspond to the correct portion of the signal compressed by the first multiplier. This can be seen in the example shown in FIG. 3.

Figure 3:
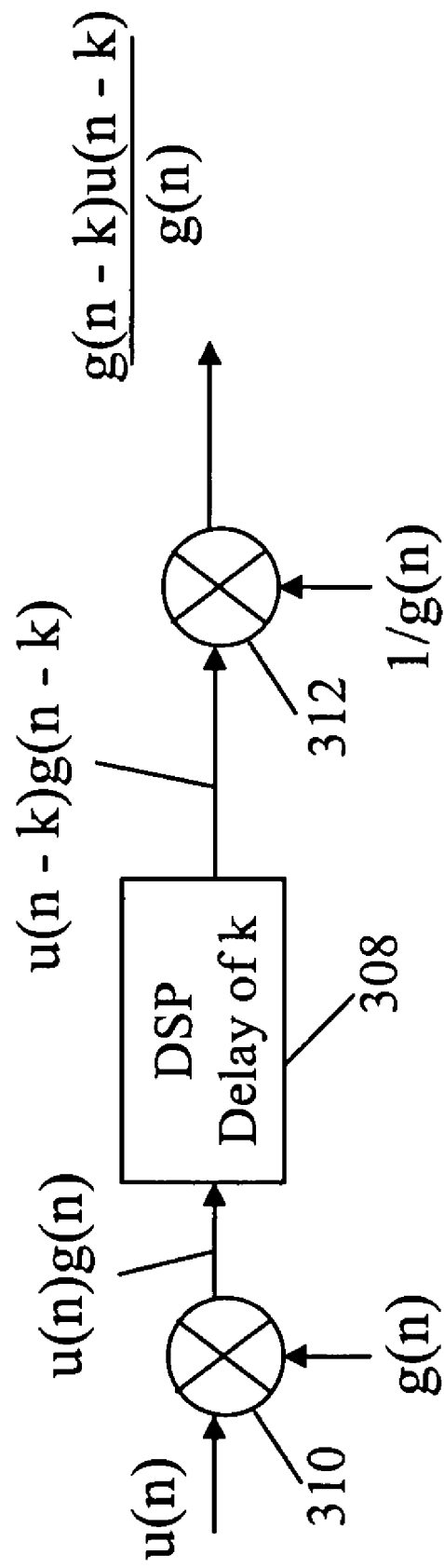
FIG. 3 is a schematic of a companding system in accordance with certain embodiments of the disclosed subject matter.

As illustrated in FIG. 3, in which DSP 308 simply delays its input by k samples, if the input to the system is u(n), the desired output of the system is u(n–k). If the input is multiplied by g(n) in multiplier 310 at the input to DSP 308, and by 1/g(n) in multiplier 312 at the output of DSP 308, these multiplications do not "cancel," as the companding system's output is (g(n–k)/g(n))u(n–k) rather than u(n–k). Thus, the system has been affected by a time varying distortion g(n–k)/g(n) that occurs from a mismatch in the multipliers 310 and 312.

Certain embodiments of the disclosed subject matter address the above-mentioned time varying distortion problem by taking the time-invariant DSP and introducing time varying adjustments in the DSP as well as in the multipliers so that the overall system remains completely or at least substantially time-invariant. In the example provided in FIG. 3, adjustments would be provided to make the output equal to u(n–k); in general, the adjustments would be made in multipliers 310 and 312 as well as in DSP 308. Therefore, time-varying behavior can be introduced within the system to reduce the quantization error and improve the performance of the signal processing, while the output signal of the overall system shows little to no time-varying distortion.

Looking back at FIG. 2, time-varying distortion may be addressed by control signals $V_1 \ldots V_N$ 230. Control signals $V_1 \ldots V_N$ 230 may be used in internal points of DSP 218 to adjust the digital signal passing through DSP 218. For example, control signals $V_1 \ldots V_N$ 230 provide DSP 218 with information on how to adjust the digital signal to account for companding. In some embodiments, DSP 218 can be adjusted according to control signals $V_1 \ldots V_N$ 230, which may implement a form of digital companding. Digital companding uses the same principle as analog companding, but is implemented on a digital signal so that the digital signal is processed close to or at the full extent of the available range at internal points of DSP 218.

Digital companding may be used within DSP 218, with adjustments coming from control signals $V_1 \ldots V_N$ 230, to remove unwanted time-varying distortion, in certain embodiments. The time-varying distortion may arise from analog companding, which takes place at input multiplier 214 and output multiplier 222, for example. In some embodiments, the disclosed subject matter performs both analog and digital companding on input signal 208 with control signals 226, 228, and 230.

Figure 4:
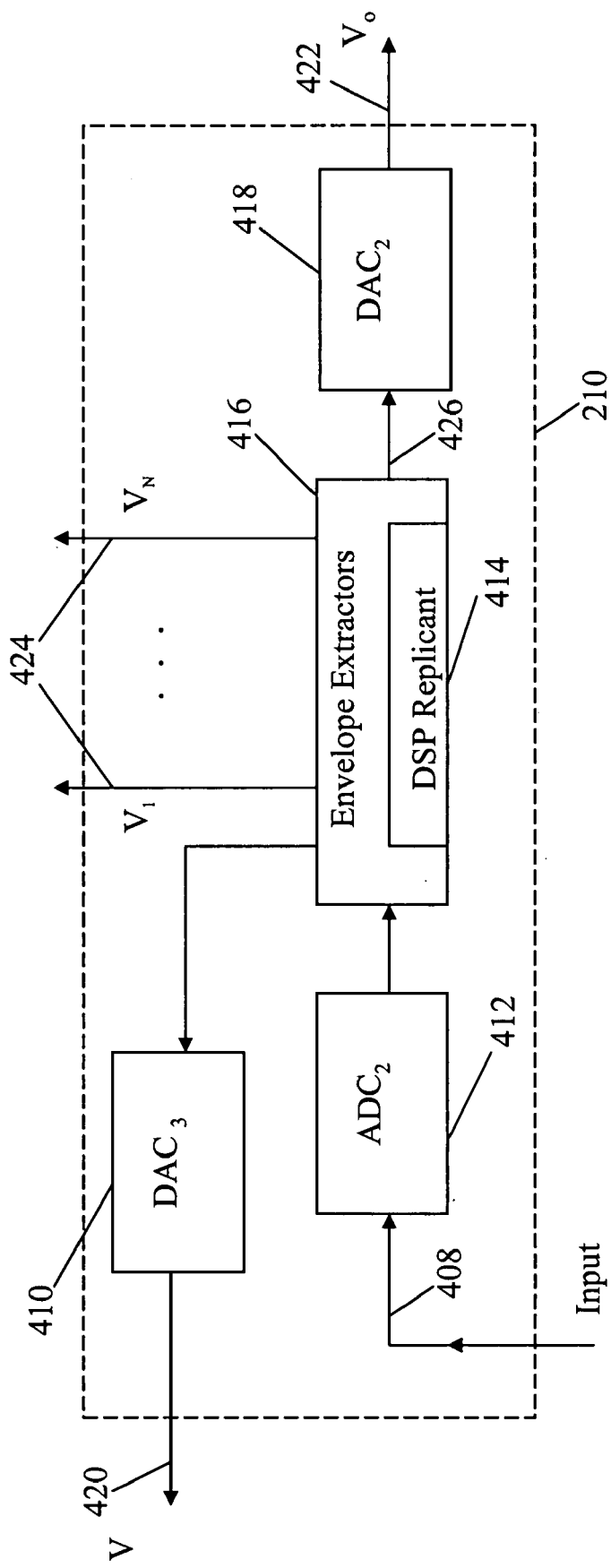
FIG. 4 is a schematic of a companding controller in accordance with certain embodiments of the disclosed subject matter.
Figure 5:
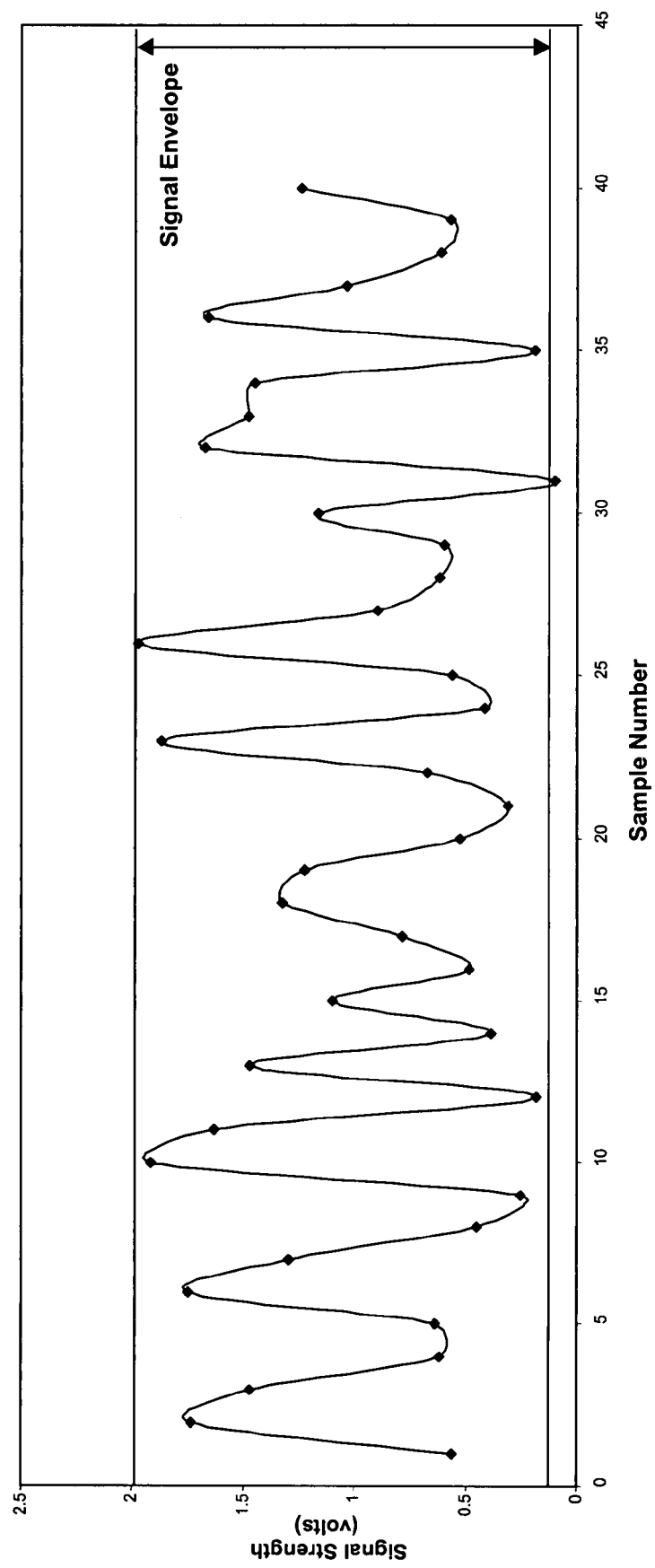
FIG. 5 is a graphical representation of a signal in accordance with certain embodiments of the disclosed subject matter.

An example of controller 210 described in connection with FIG. 2 is now described in greater detail with reference to FIG. 4. One embodiment of controller 210 is shown in FIG. 4 and includes two DACs ($DAC_2$ 418 and $DAC_3$ 410), $ADC_2$ 412, DSP Replicant 414 (which is also a fixed-point DSP, similar to DSP 218), and one or more envelope extractors 416. Generally speaking, an envelope extractor samples a signal and provides a measurement of the signal's range or amplitude over a specified period of time. The envelope is a measurement of the boundaries a signal ranges between during a given period of time. For example, if the maximum intensity of a signal is 3 volts and the minimum intensity is 1 volt, then its signal envelope would be 2 volts. An example of a signal envelope is shown in FIG. 5.

In operation, the input signal enters controller 210 and is converted to a digital signal by $ADC_2$ 412. The digital signal then enters envelope extractors 416, that then output a digital control signal (input envelope) to $DAC_3$ 410. Envelope extractors 416 may be embodied as a single envelope extractor which detects multiple signals, or as multiple envelope extractors with each detecting one or more signals. After passing through $DAC_3$ 410, the input envelope is an analog input control signal $V_i$ 420, which can be used to adjust multiplier 214 (FIG. 2).

Envelope extractors 416 measure some of the internal signal states of DSP Replicant 414 and output digital DSP control signals $V_1 \ldots V_N$. After performing certain DSP processing in DSP Replicant 414 in response to the digital signal exiting $ADC_2$ 412, the modified digital signal is detected by envelope extractors 416 and a digital output control signal (output envelope) is produced. The output envelope is converted to an analog output control signal $V_o$ 422 by $DAC_2$ 418 which is used to control multiplier 222 (FIG. 2).

In the embodiment of controller 210 shown in FIG. 4, control signals $V_i$ 420, $V_o$ 422, and $V_1 \ldots V_N$ 424 are based on envelope extractors 416 that detect how input signal 408 passes through fixed-point DSP Replicant 414. By using DSP Replicant 414 in combination with envelope extractor 416, the envelope of input signal 408 can be measured, along with the envelopes of a subset of the states in DSP Replicant 414 and output signal 426.

As shown in FIG. 4, controller 210 uses DSP Replicant 414 and envelope extractors 416 to regulate control signals $V_i$ 420, $V_o$ 422, and $V_1 \ldots V_N$ 424 so the measured envelope of the input signal is adjusted to approach the maximum allowable envelope of at least one of ADC 216, DSP 218, and DAC 220 without exceeding it, thereby avoiding distortion and clipping. DSP Replicant 414 may also use software algorithms within DSP 218 to act upon control signals $V_1 \ldots V_N$ 424 to control at least some of the states of DSP 218 and to ensure that signals in DSP 218 are sized to take advantage of the range of the DSP 218.

Generally speaking, a DSP, such as DSP 218 or DSP Replicant 414, has a number of states that correspond in some manner to the number of delays present in the DSP. Those states can be represented by state equations or state vectors. Control signals $V_1 \ldots V_N$ 424 may be formed by using envelope extractors 416 to measure the envelope of the signal present at some number of the states in DSP Replicant 414. Control signals $V_1 \ldots V_N$ 424 can then be used to adjust the signals at some number of the states present in DSP 218. In some embodiments, it may be possible to mitigate distortion introduced to input signal 208 by implementing digital companding to only some of the states in DSP 218 (and the signals associated with these states). An example of this is when control signals $V_1 \ldots V_N$ 230 use less than N signals for an N state DSP 218, and still control distortion in DSP 218.

As shown in FIG. 3, distortion can result in a system when an input signal is multiplied by a time-varying signal, and the output signal is multiplied by the reciprocal of this time-varying signal, but there is no correction made to at least some of the internal states of the DSP. As explained above, the correction made to the internal states can be done through control signals 230 of FIG. 2. Some of the general theoretical foundations of how control signals can reduce quantization noise in signal processing via companding are described in a 1997 IEEE paper by Yannis Tsividis entitled "Externally Linear, Time-Invariant Systems and Their Application to Companding Signal Processors" which is hereby incorporated by reference herein in its entirety.

A mathematical explanation of how control signals can be used to implement companding is given below for a general system, such as system 200 of FIG. 2, with reference to equations 1-4 and FIGS. 6A and 6B. A more specific implementation, where a DSP implements a reverberator, is provided further below and applies the equations and ideas presented in this more general explanation.

Figure 6A:
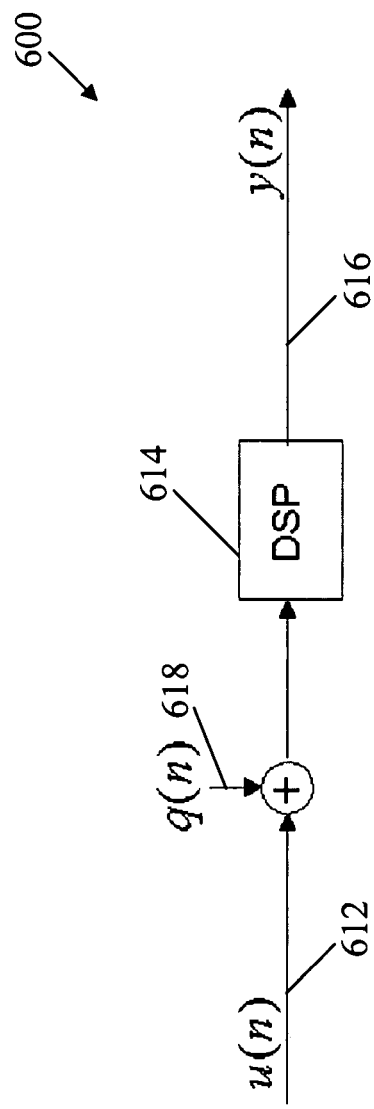
FIGS. 6A and 6B are schematics of fixed-point digital signal processing systems in accordance with certain embodiments of the disclosed subject matter.

To start, consider a linear, time-invariant (LTI) discrete-time $m^{th}$ order system 600 as shown in FIG. 6A which includes a single input u(n) 612, state vector $x(n)=(x_i(n))$ for DSP 614, a single output y(n) 616, and quantization error q(n) 618 of an ADC (not shown) between u(n) 612 and DSP 614. Initially, assuming that q(n) is zero, the state equations of system 600 are of the form:

$$x(n+1)=Ax(n)+Bu(n)$$

$$y(n)=Cx(n)+du(n) \quad \text{Equations 1}$$

where $A=(a_{ij})$ is an m×m matrix, $B=(b_i)$ is an m×1 column vector, $C=(c_j)$ is an 1×m row vector, and d is a scalar. System 600 with q(n) equal to zero describes an ideal embodiment of system 100 in FIG. 1, where ADC 104 and DAC 108 are of infinite resolution (i.e., there is no quantization error). Certain embodiments of the disclosed subject matter, such as system 200, are represented by a modified system 650 of FIG. 6B, where multipliers 652 and 654 are similar to multipliers 214 and 222, respectively, where q(n) 656 represents quantization error from ADC 216, and where DSP 658 is similar to DSP 218. In FIG. 6B, system 650 is fed by the same input u(n) as system 600 and produces the same zero-state output y(n) as system 600, but companding is introduced into system 650 with a modified û(n) at the input to DSP 658, a modified ŷ(n) at the output from DSP 658, and modified state variables $\hat{x}_i(n)$. Equations 2 show the correspondence of variables between system 600 and system 650 below:

$$\hat{u}(n) = \frac{u(n)}{e_u(n)}$$

$$\hat{y}(n) = \frac{y(n)}{e_y(n)}$$

$$\hat{x}_i(n) = \frac{x_i(n)}{e_{x_i}(n)}, i = 1, \ldots, n$$

Equations 2 where $e_u(n)$, $e_y(n)$, and $e_{x_i}(n)$ are control signals, may be similar to control signals 226, 228, and 230, respectively, of FIG. 2, and may be related to the envelope of signals in system 600. Substituting equations 2 into equations 1 produces the state equations of system 650, which can be shown to be:

$$\hat{x}(n+1) = \hat{A}(n)\hat{x}(n) + \hat{B}(n)\hat{u}(n)$$

$$\hat{y}(n) = \hat{C}(n)\hat{x}(n) + \hat{d}(n)\hat{u}(n) \qquad \text{Equations 3}$$

where $\hat{A} = \hat{a}_{ij}(n)$, $\hat{B} = \hat{b}_i(n)$, $\hat{C} = \hat{c}_j(n)$, and $\hat{d}(n)$ have the same dimensions as A, B, C and d, but are their companded counterparts. After some algebra, the elements of $\hat{A}$, $\hat{B}$, $\hat{C}$, and $\hat{d}$ are found to be given by:

$$\hat{a}_{ij}(n) = a_{ij} \frac{e_{x_j}(n)}{e_{x_i}(n+1)} \qquad \text{Equations 4}$$

$$\hat{b}_i(n) = b_i \frac{e_u(n)}{e_{x_i}(n+1)}$$

$$\hat{c}_j(n) = c_j \frac{e_{x_j}(n)}{e_y(n)}$$

$$\hat{d}(n) = d \frac{e_u(n)}{e_y(n)}$$

Figure 6B:
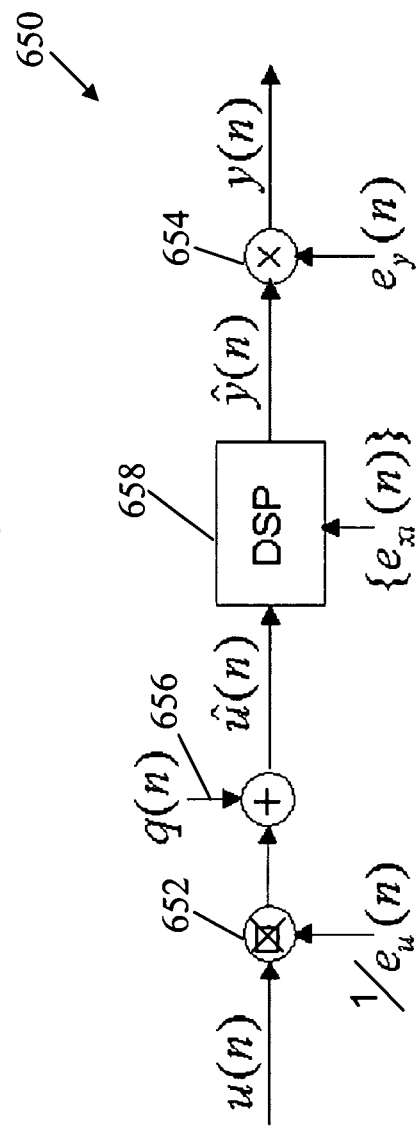

As shown in the modified system 650 in FIG. 6B and in equations 2, 3 and 4, internal signals $\hat{u}(n)$, $\hat{y}(n)$, and $\hat{x}(n)$ can be adjusted by control signals $e_u(n)$, $e_y(n)$ and $e_{x_i}(n)$. Further, these internal signals can be scaled dynamically to other desired values without disturbing output y(n).

If control signals $e_u(n)$, $e_y(n)$ and $e_{x_i}(n)$ are derived from the input to the system, as shown in FIG. 2, modified system 650 becomes internally nonlinear, while its external behavior is similar to system 600. The input-output behavior of systems 600 and 650 may be different from one another if quantization error q(n) 618 is introduced as a non-zero entity.

In the case where a non-zero quantization error q(n) is used, the input to DSP 614 (FIG. 6A) becomes u(n)+q(n) and the input to DSP 658 (FIG. 6B) becomes $e_u^{-1}(n)u(n)+q(n)$. Scaling the envelope of input u(n) by a factor of $e_u^{-1}(n)$ varies the input u(n) by a factor of $e_u^{-1}(n)$, while the quantization error q(n) remains the same. This can be used to improve the signal-to-quantization-error ratio by a factor of $e_u^{-1}(n)$ when the input u(n) is smaller than the full range of a DSP because the quantization error is introduced after the scaling and remains the same, while the signal is increased relative to the quantization error. Similar results may be obtained for errors due to limited-precision fixed-point arithmetic in a DSP.

In some embodiments of the disclosed subject matter, quantization error present from ADC 412 still causes signal envelopes measured by DSP Replicant 414 to suffer from quantization noise. These errors are not a serious problem because DSP Replicant 414 is only used to give a relative measurement of how the signal will pass through a fixed-point DSP, such as DSP 218. Thus, even if the signal envelopes can only be determined within what would normally be the rounding or quantization error for an input signal to a fixed-point system, these envelopes can still be used to better size the corresponding signal for when it will pass through DSP 218. Because the rounding error is typically much smaller than the full range of a fixed-point device, this rounding error is usually acceptable for the purposes of generating control signals.

Figure 7:
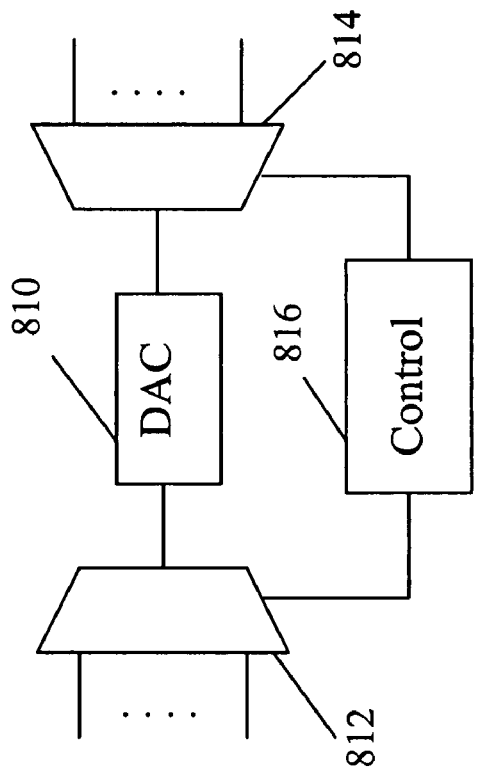
FIG. 7 is a schematic of a system for sharing an analog-to-digital converter in accordance with certain embodiments of the disclosed subject matter.

In suitable embodiments of the disclosed subject matter, ADC 216 and ADC$_2$ 412 can be combined into a single ADC 710 using multiplexer 712 and demultiplexer 714 as shown in FIG. 7. As illustrated, the signals enter a multiplexer (MUX) 712 that directs the signals into ADC 710. At the other end of ADC 710, a demultiplexer (DEMUX) 714 routes the signal to the correct output. MUX 712 and DEMUX 714 may be controlled by controller 716 to ensure their switching is coordinated. The control of MUX 712 and DEMUX 714 can be, for example, time-based, where each input is switched into ADC 710 for a specified amount of time and then switched out for an amount of time. Other methods for controlling the switching of MUX 712 and DEMUX 714 can be used as well. Another method, for example, is priority switching where each input is assigned a priority and when multiple signals are competing for access to ADC 710, the signal with the highest priority will gain access. Once the request of the highest priority input line is fulfilled, the next highest priority input is granted access.

Figure 8:
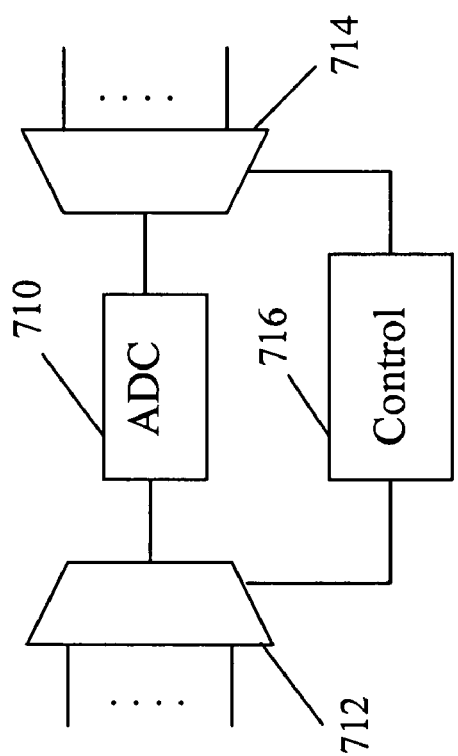
FIG. 8 is a schematic of a system for sharing a digital-to-analog converter (DAC) in accordance with certain embodiments of the disclosed subject matter.

Similarly, DAC 220, DAC$_2$ 418, and DAC$_3$ 410 can be combined into a single DAC 810 using a multiplexing scheme as shown in FIG. 8. The multiplexing involved in FIG. 8 is similar to that of FIG. 7. As shown, a MUX 812 is at the input and DEMUX 814 is at the output of DSP 810. MUX 812 and DEMUX 814 may be controlled by a controller 816, which, for example, can implement time-based or priority-based switching as described above.

Figure 9:
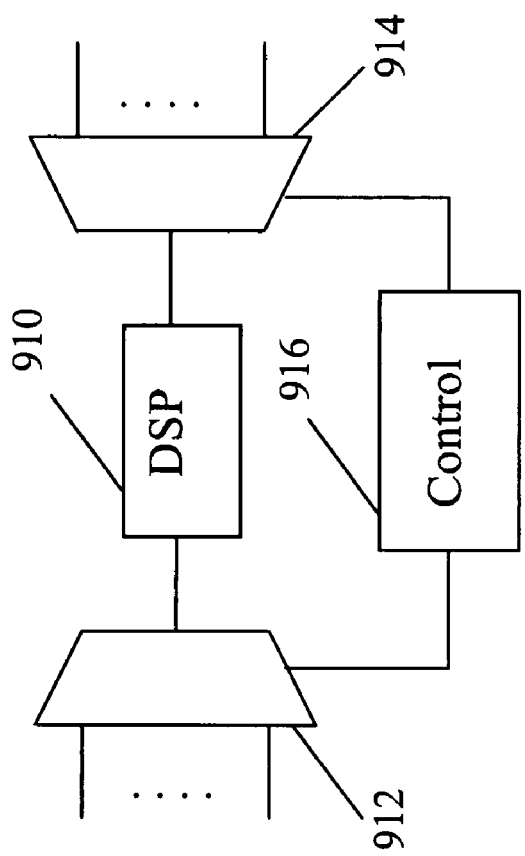
FIG. 9 is a schematic of a system for sharing a digital signal processor in accordance with certain embodiments of the disclosed subject matter.

Likewise, it may be desirable to combine DSP 218 and DSP Replicant 414 into a DSP 910 as shown in FIG. 9. This arrangement is similar to that in FIGS. 7 and 8 in that MUX 912, DEMUX 914, and controller 916 may be used to route the signals.

Figure 10:
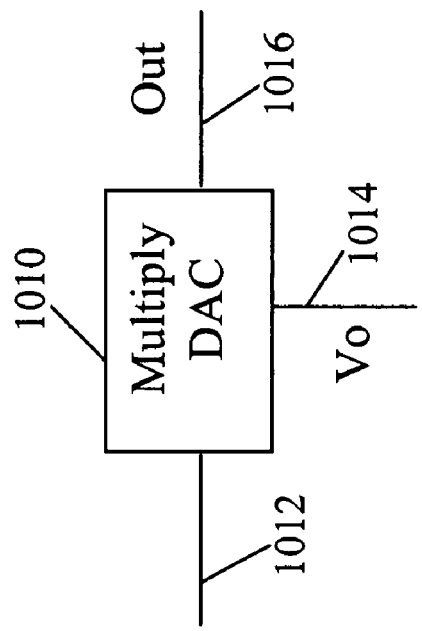
FIG. 10 is a schematic of a multiply DAC in accordance with certain embodiments of the disclosed subject matter.

A multiplying DAC 1010 may be used instead of DAC 220 and multiplier 222 as shown in FIG. 10. Multiplying DAC 1010 takes the digital signal 1012 inputted to it (e.g., from DSP 218), as well as control signal V$_o$ 1114 (e.g., from controller 210), and outputs a modified signal 1016.

Figure 11:
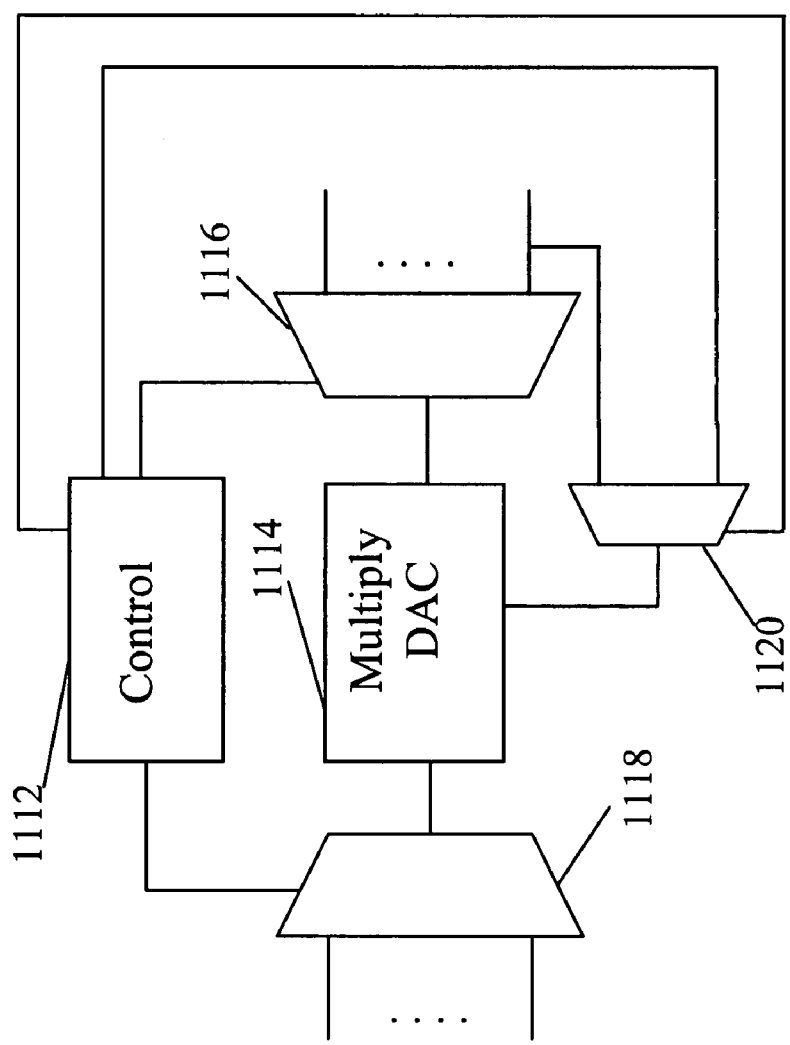
FIG. 11 is a schematic of a multiply DAC with supporting devices in accordance with certain embodiments of the disclosed subject matter.

As shown in FIG. 11, DACs 220, 410, and 418 and output multiplier 222 may also be combined using MUXs 1118 and 1120. MUX 1118 may be used to switch the signals normally inputted into DAC 220, DAC$_2$ 418, and DAC$_3$ 410 into multiplying DAC 1114. MUX 1120 may be used to switch multiplying value V$_o$ or a constant value, such as one (for the signals that should not be modified) into multiplying DAC 1114. DEMUX 1116 may be used to route the signals normally outputted from DAC 220, DAC$_2$ 418, and DAC$_3$ 410 from multiply DAC 1114 to the appropriate locations in system 200. Finally, controller 1112 may be used to regulate MUXs 1118 and 1120, and DEMUX 1116, and supply a constant value to input into multiply DAC 1114 (such as one, when the signal should not be modified).

Figure 12:
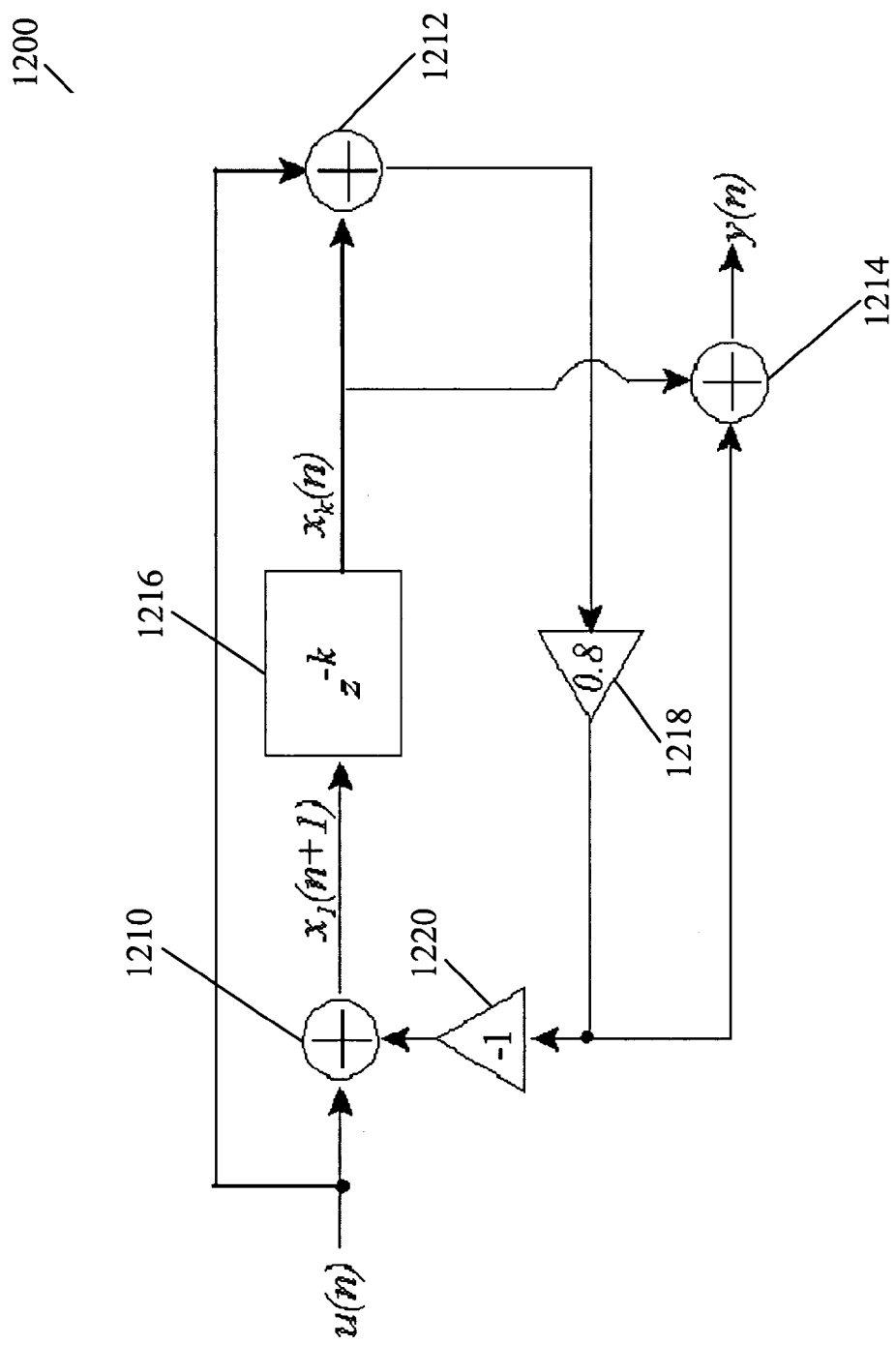
FIG. 12 is a schematic of a simple digital reverberator, used as a case study to illustrate benefits of companding, in accordance with certain embodiments of the disclosed subject matter.

An example of an implementation of the disclosed subject matter is companding on a simple reverberator 1200. This simple reverberator, without companding, is shown in FIG. 12 (using a Matlab/Simulink representation). Reverberator 1200 can be implemented by a DSP, such as DSP 218, and includes adders 1210, 1212, and 1214, k delay element 1216, and coefficient multipliers 1218 and 1220. The following example applies the math and equations described above to these embodiments of the disclosed subject matter. The state equations for reverberator 1200, which are found by taking the states at the outputs of k delay element 1216, are:

$$x_1(n+1) = -0.8x_k(n) + 0.2u(n)$$

$$x_i(n+1) = x_{i-1}(n), \; 2 \leq i \leq k$$

$$y(n) = 1.8x_k(n) + 0.8u(n) \qquad \text{Equations 5}$$

When equations 5 are put in the form of equations 1, the following is determined: $a_{i,i-1} = 1$ for $2 \leq i \leq k$; $a_{1k} = 0.8$; $b_1 = 0.2$; $c_k = 1.8$; $d = 0.8$. All other entries in A, B and C are zero. From equations 5, $x_i(n+1)=x_{i-1}(n)$ for $2 \leq i \leq k$. It follows that $x_k(n)=x_1(n+1-k)$. From these relations and equations 2, it can be shown that the following corresponding set of relations also hold: $e_{x_i}(n+1)=e_{x_{i-1}}(n)$ for $2 \leq i \leq k$, and $e_{x_k}(n)=e_{x_1}(n+1-k)$. Using this corresponding set of relations in equations 4, the following is obtained:

$$\hat{a}_{i,i-1} = 1, 2 \leq i \leq k:$$

$$\hat{a}_{1k} = -0.8 \frac{e_{x_k}(n)}{e_{x_1}(n+1)}:$$

$$\hat{b}_1 = 0.2 \frac{e_u(n)}{e_{x_1}(n+1)}:$$

$$\hat{c}_k = 1.8 \frac{e_{x_k}(n)}{e_y(n)}:$$

$$\hat{d} = 0.8 \frac{e_u(n)}{e_y(n)}.$$

All other entries in $\hat{A}$, $\hat{B}$, and $\hat{C}$ are zero. The state equations 3 for the reverberator become:

$$\hat{x}_1(n+1) = \left[-.8 \frac{e_{x_1}(n+1-k)}{e_{x_1}(n+1)}\right]\hat{x}_k(n) + \left[.2 \frac{e_u(n)}{e_{x_1}(n+1)}\right]\hat{u}(n) \quad \text{Equations 6}$$

$$\hat{x}_i(n+1) = \hat{x}_{i-1}(n), 2 \leq i \leq k$$

$$\hat{y}(n) = \left[1.8 \frac{e_{x_1}(n+1-k)}{e_y(n)}\right]\hat{x}_k(n) + \left[.8 \frac{e_u(n)}{e_y(n)}\right]\hat{u}(n)$$

As seen above, it can be shown that k−1 of the k control signals corresponding to the k states of the k-delay element 1216 are cancelled out in the ratios of equations 4. This occurs for every k-delay element 1216, since properly companding the input of a k-delay element ensures that all the internal states of this element are also properly companded. Thus, using this approach, it is possible to eliminate control signals for the intermediate state variables and use fewer control signals (such as control signals 230) to remove time-varying distortion and other forms of distortion.

Let N be the number of bits used to store the companded variables on the left-hand side of equations 6. Since these variables are properly companded according to certain embodiments of the disclosed subject matter, they have roughly constant envelopes, so N may be chosen small without resulting in large quantization noise. Unfortunately, the individual terms in the sums of equations 6 are not companded, so these terms may not have constant envelopes, and if only N bits were used to store these terms, significant quantization noise would result. Since, in many N-bit fixed-point DSPs, N-bit multiplications require 2N-bit additions, the N-bit DSPs would generally support 2N-bit addition and temporary storage of 2N-bit values. Therefore, in some embodiments of the disclosed subject matter, the individual terms in the sums of equation 6 are temporarily stored and added using 2N-bits, and the results, which are the properly companded variables on the left-hand side of equations 6, are then stored in memory and multiplied by appropriate gains using only N bits. As one skilled in the art would appreciate, this method can be used in other instances of signal manipulation and processing where such a situation is presented.

In some embodiments, equations 6 can be simplified to reduce the computation complexity. If the signals corresponding to the various variables of $e_{x1}$, $e_y$, and $e_u$ are constrained to be integer powers of 2 and the base 2 logs of these variables are stored instead of the variables themselves, the divisions become simple subtractions, and the multiplications become simple shifts. In some embodiments of the disclosed subject matter, equations 6 is implemented in fixed-point hardware using this modification. Furthermore, in certain embodiments, the number of bits used for storing the envelopes can be reduced by constraining the envelopes to be integer powers of 2 and only storing the associated base 2 logs. For those embodiments which use an ADC to digitize the input envelope, using fewer bits for the envelope can reduce the cost, power and area of this ADC.

Figure 13:
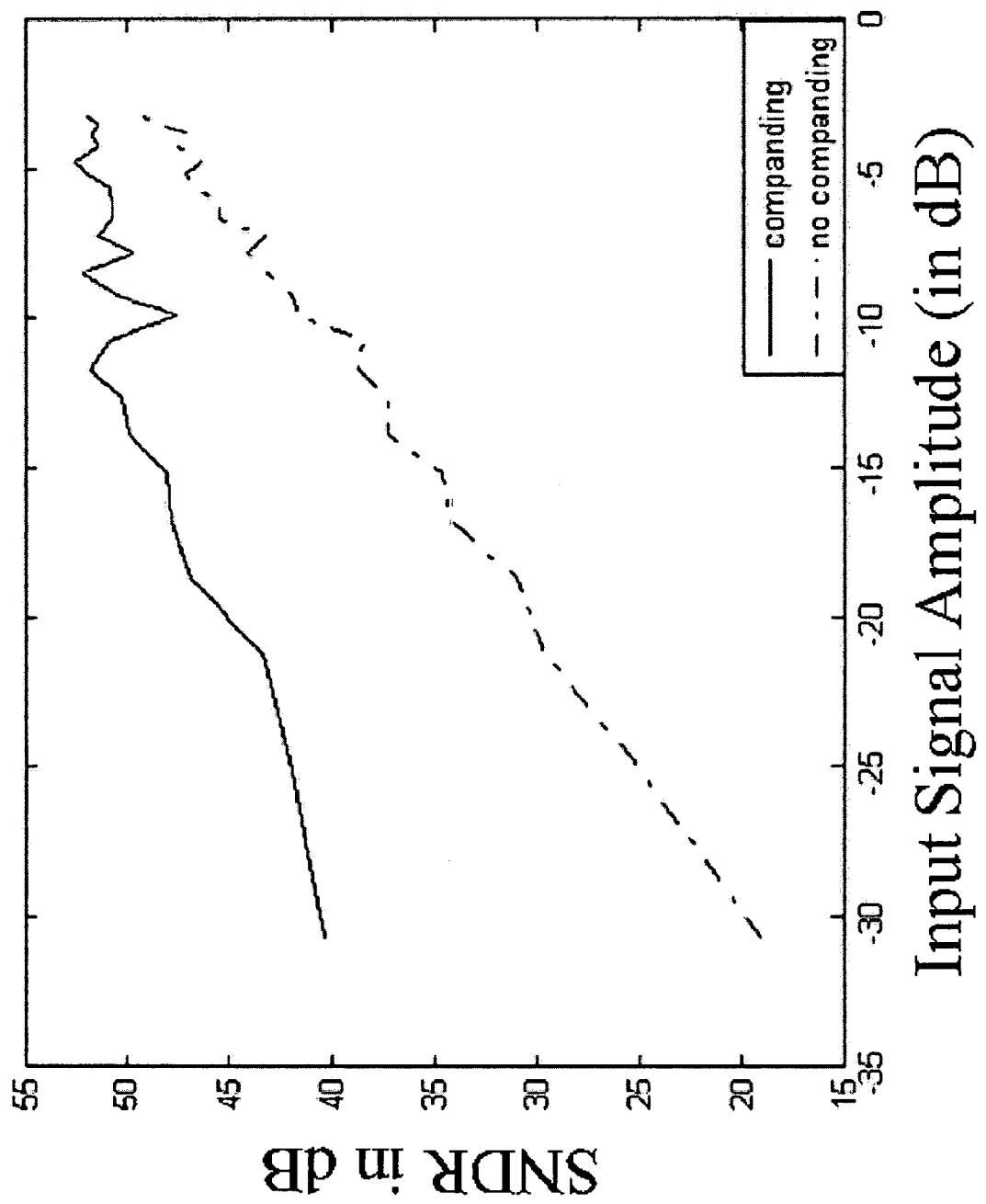
FIG. 13 is a graphical representation of signal-to-noise-plus-distortion ratios for processing with companding versus without companding in accordance with certain embodiments of the disclosed subject matter.

A system using two of the reverberators of FIG. 12 was simulated in Matlab/Simulink with a sample rate of 44.1 kHz; the first stage had a k delay element 1216 with k=2000 and the second stage had a k delay element 1216 with k=4410. For this two-stage reverberator, certain embodiments of system 100 of FIG. 1 and companding system 200 of FIG. 2 were simulated using a sinusoidal input. Controller 210 of system 200 was of a form similar to that shown in FIG. 4. The simulations were run in a fixed-point mode with 8, 9, 10, and 11 bit systems, and the same precision was used for all the parts of controller 210, which are shown in FIG. 4. For the purposes of this example, all the outputs of envelope extractors 416 were made to be at least a small non-negative amount (to avoid possible division by 0 in, for example, multiplier 214). This approach does not catch all nuances of the envelope variations of the signals, so the resulting companding signals can have some envelope variation; nevertheless, good results are obtained from the companding system 200 relative to system 100, as can be seen in FIG. 13. Since detecting the envelope at time-step no requires knowledge of input signal 208 at time-step $n_0+1$, a single-sample delay (optional delay 212) was used to make envelope detection a causal process.

Figure 14:
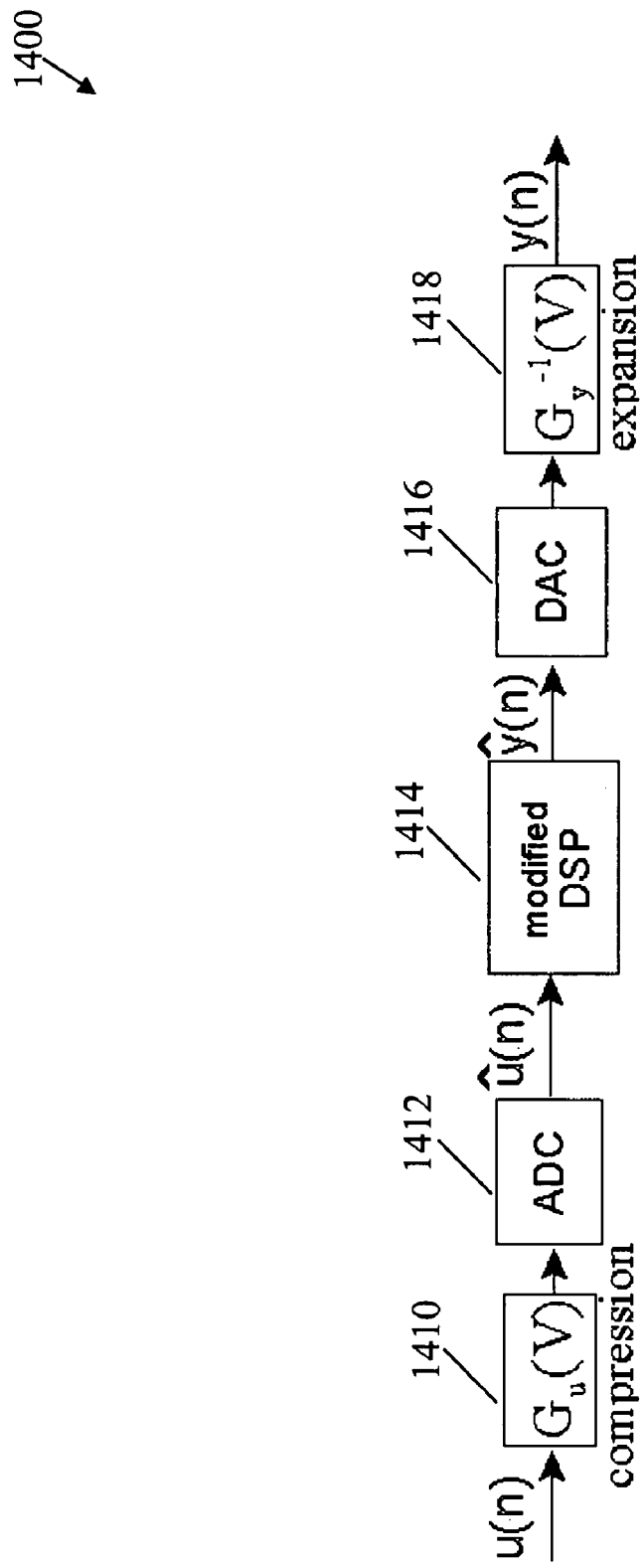
FIG. 14 is a schematic of a companding ADC-DSP-DAC system in accordance with certain embodiments of the disclosed subject matter.

FIG. 14 illustrates a companding ADC-DSP-DAC circuit 1400 utilizing lookup tables in accordance with certain embodiments of the disclosed subject matter. Companding ADC-DSP-DAC circuit 1400 includes a compressor element 1410, an ADC 1412, a modified DSP 1414, a DAC 1416, and an expander element 1418. Compressor element 1410 and expander element 1418 modify the signal according to a general function and an inverse of that general function, respectively. This signal modification may be implemented with a lookup table, a specialized piece of hardware, or any other suitable mathematical device. Modified DSP 1414 may also use nonlinear lookup tables to introduce internal nonlinearities and to ensure that signals in the DSP take advantage of the full range available. ADC 1412 and DAC 1416 are similar in operation to ADC 216 and DAC 220 of FIG. 2.

Figure 15:
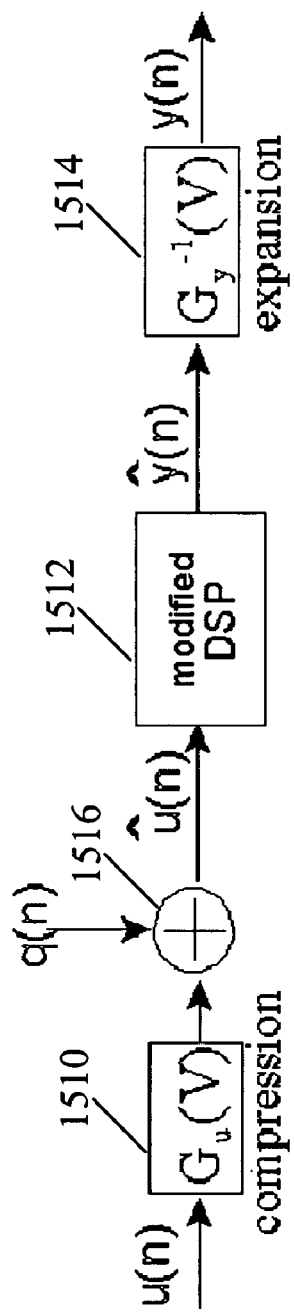
FIG. 15 is a schematic of a general function companding DSP system in accordance with certain embodiments of the disclosed subject matter.

FIG. 15 illustrates a companding DSP circuit 1500 where a generalized function is used for compression and expansion in accordance with certain embodiments of the disclosed subject matter. Companding DSP circuit 1500 includes a compressor element 1510, a modified DSP 1512, an expander element 1514, and a (conceptual) quantization noise adder 1516. Compressor 1510 and expander 1514 perform similar signal manipulations as multipliers 214 and 222 of FIG. 2, multipliers 310 and 312 of FIG. 3, and multipliers 652 and 654 of FIG. 6B, when these multipliers are multiplying the signal with a general function and its inverse. In some embodiments, the lookup tables may be implemented in a controller, as will be explained later with reference to FIG. 16.

Notwithstanding the names given to the compressor element and the expander element, the compressor element may be used to perform both compression and/or expansion of a given signal, and the expander element may be used to reverse such compression and/or expansion as appropriate. Looking at FIG. 1, for example, line 150 shows that a signal is expanded when it is small and compressed when it is large. Thus, a multiplier (such as 214) or a compressor (such as 1410) implementing a function such as line 150 would perform both compression and expansion on a signal.

As mentioned above, a general function, g(v), may be selected to compress the signal dynamic range and $g^{-1}(v)$ is the function that re-expands the signal dynamic range. An example of a compression characteristics the μ law, which was given above and reproduced below:

$$\gamma(\upsilon) = \frac{\log(1 + \mu\upsilon)}{\log(1 + \mu)}, \upsilon \geq 0$$

$$\gamma(\upsilon) = -\gamma(-\upsilon) = -\frac{\log(1 - \mu\upsilon)}{\log(1 + \mu)}, \upsilon < 0$$

where μ corresponds to the amount of compression. As shown above, the base of the logarithm is not specified because the bases of the logarithms in the numerator and denominator are the same. For the rest of this discussion, the logarithms are shown as base 2, and are therefore written as lg. In addition, υ and γ(υ) are assumed to be normalized between −1 and 1. If the numbers in the DSP are to be signed integers, then υ is scaled by $2^{-(2N-1)}$, and g(υ) is scaled by $2^{N-1}$ because the g(v) function takes an uncompressed 2N-bit number as an input and outputs a compressed N-bit number. Given the above, g(v) is given by:

$$g(\upsilon) = \frac{2^{N-1}lg\left(1 + \mu\frac{\upsilon}{2^{2N-1}}\right)}{lg(1 + \mu)}, \upsilon \geq 0 \quad \text{Equations 7}$$

$$g(\upsilon) = -g(-\upsilon) = \frac{-2^{N-1}lg\left(1 - \mu\frac{\upsilon}{2^{2N-1}}\right)}{lg(1 + \mu)}, \upsilon < 0$$

Inverting equations 7 to get the inverse function, $g^{-1}(v)$ gives:

$$g^{-1}(\upsilon) = \frac{2^{2N-1}}{\mu}\left(2^{\frac{lg(1+\mu)\upsilon}{2^{N-1}}} - 1\right), \upsilon \geq 0 \quad \text{Equations 8}$$

$$g^{-1}(\upsilon) = -g^{-1}(-\upsilon) = -\frac{2^{2N-1}}{\mu}\left(2^{\frac{-lg(1+\mu)\upsilon}{2^{N-1}}} - 1\right),$$

$$\upsilon < 0$$

Depending on the embodiment, g(v) may be implemented with an analog circuit at the input of the ADC, and $g^{-1}(v)$ may be implemented with an analog circuit at the output of the DAC. In some embodiments, g(v) is incorporated into the ADC by using a nonlinear ADC and $g^{-1}(v)$ is incorporated into the DAC using a nonlinear DAC. Certain embodiments of the disclosed subject matter implement instantaneous companding through the use of lookup tables. Thus, controller 210 of FIG. 2 may be eliminated and lookup tables used instead to introduce nonlinear signal modifications. These nonlinear signal modifications can be performed by multipliers (such as multipliers 214 and 222), by other specialized hardware (such as a comparator that looks up the input to find the corresponding function manipulated output), and by the DSP (such as DSP 218).

In explaining how to implement these lookup tables, a general function with no specific form is used. However, these functions may be chosen to minimize quantization error from ADC quantization effects and fixed-point arithmetic. An example of such a quantization error minimizing function is illustrated in FIG. 1 and equations 7 and 8. For the purposes of this explanation, only a single-input, single-output case is considered herein. As one skilled in the art would appreciate, the disclosed subject matter can be extended to build a multiple-input, multiple-output device, or any variation thereof. Furthermore, single variable general functions are considered such that the $i^{th}$ function of G(x(n)) is only a function of $x_i(n)$. The general functions, in this discussion, are also chosen to have the same functional form so that there is only one invertible general function, $g^{-1}(v)$, where v is a scalar; the $i^{th}$ function of G(x(n)) is $\hat{x}_i(n)=g(x_i(n))$, $G_u(u(n))$ is $\hat{u}(n)=g(u(n))$, and $G_y(y(n))$ is, $\hat{y}(n)=g(y(n))$. As one skilled in the art would appreciate, more complex nonlinear functions may be used with various embodiments of the disclosed subject matter.

An explanation of how to implement the lookup tables begins with expanding and generalizing equations 3 from above to give equations (for 1≦i≦m) of the form:

$$\hat{x}_i(n+1) = g\left(\sum_{j=1}^{m} a_{ij}g^{-1}(\hat{x}_j(n)) + b_i g^{-1}(\hat{u}(n))\right) \quad \text{Equations 9}$$

$$\hat{y}(n) = g\left(\sum_{j=1}^{m} c_j g^{-1}(\hat{x}_j(n)) + d g^{-1}(u(n))\right)$$

Equations 9 are implemented on an N-bit fixed-point processor 1512, and a technique for minimizing quantization errors is presented in accordance with certain embodiments of the disclosed subject matter. When implementing a companding N-bit fixed-point processor 1512, the general function, g(v) may be chosen to allow û(n), ŷ(n), and x̂(n) to take advantage of full range of processor 1512, and to be stored in N-bit registers without causing too much quantization error. However, this cannot be assumed for $g^{-1}(v)$ (i.e., $g^{-1}(\hat{x}_j(n))$, $g^{-1}(\hat{u}(n))$, and $g^{-1}(\hat{y}(n))$) because these are $x_j(n)$, u(n), and y(n), respectively, and so storing them in N-bit registers may lead to quantization distortion if they do not take advantage of the full range of the register. A technique to avoid this involves manipulating certain properties of an N-bit fixed-point DSP.

Typically, to allow for N-bit multiplication, an N-bit DSP supports 2N-bit addition and 2N-bit numbers are a supported "accumulator data-type." In such cases, typically, these 2N-bit numbers are stored temporarily and added (or subtracted), but they are not stored in registers. Rather, they are typically used only in the time step during which they are generated. In some embodiments, the $g^{-1}(v)$ function is implemented on DSP 1512 using one or more lookup tables and any coefficient multipliers, such as $a_{ij}$, $b_i$, $c_j$, and d, which are absorbed into the one or more lookup tables. Thus, if the desired signal is α $g^{-1}(v)$ the corresponding lookup table outputs a 2N-bit number which represents α $g^{-1}(v)$ instead of storing $g^{-1}(v)$ in an N-bit register and later multiplying it by α. The benefit of this is that quantization error is reduced by expanding $g^{-1}(v)$ through a multiplication with the coefficient gain. In some embodiments, the lookup table for the general function, g(v), takes an uncompressed 2N-bit number as an input and outputs a compressed N-bit number. The lookup table for the inverse function, $g^{-1}(v)$, which outputs α $g^{-1}(v)$ in certain embodiments, takes a compressed N-bit number as input and outputs an uncompressed 2N-bit number. Thus, in this setup, the input to and output of modified DSP 1512 are compressed N-bit numbers, which allows the use of an N-bit ADC, DSP, and DAC in some embodiments.

The generation of the lookup tables in DSP 1512 may occur before runtime, so that it does not have to occur in real-time. In certain embodiments where the lookup tables are generated before runtime, floating-point arithmetic can be used to generate the lookup table correspondences. In developing the lookup table in some embodiments as discussed below, there are $2^{2N}$ possible inputs, but only $2^N$ possible outputs because the g(v) function takes a 2N-bit integer as an input and outputs an N-bit integer. As long as each 2N-bit integer gives a distinct N-bit integer, $2^N$ $2^N$-bit integers may be used. The exact mapping of the 2N-bit integers to the distinct N-bit integers does not impact the companding DSP circuit as long as the mapping is done in a consistent fashion. In some embodiments of the disclosed subject matter, the lookup table can store 2N-bit integers, for example, by using 2 registers for each integer. A lookup is done by funding the 2N-bit integer in the table's input column that is closest to the input by using a binary search, for example, and then the corresponding N-bit integer is outputted. In certain embodiments, every application or device using g(v) may use the same lookup table, so that only one instance of g(v) is stored in memory. The total memory requirement for the g(v) lookup table is $2^N(2N+N)=2^N3N$ bits.

In developing a lookup table for $g^{-1}(v)$, the input and output columns of the g(v) lookup table may be flipped. In some embodiments, to obtain the $ag^{-1}(v)$ lookup table, each entry of the output column is multiplied by a and the result is rounded to the nearest 2N-bit number. There are 2N entries, one for every possible N-bit integer, so the lookups may be implemented directly, which is efficient since no search is required. Furthermore, the input column may be eliminated if the input is first offset so that the lowest possible input value is zero such that the table becomes an array with the input being the array index. If the input is in two's complement initially, offsetting may be accomplished through a bitwise exclusive-or with one followed by N−1 zeros, thus inverting the most significant bit. The memory requirement for each $ag^{-1}(v)$ lookup table may be $2^N2N$ bits. In some embodiments, this memory requirement may be eased by using less rows in the lookup tables. However, using less rows can increase quantization errors, so manipulating the number of rows in the lookup tables is a way to tradeoff memory requirement for performance.

Figure 19:
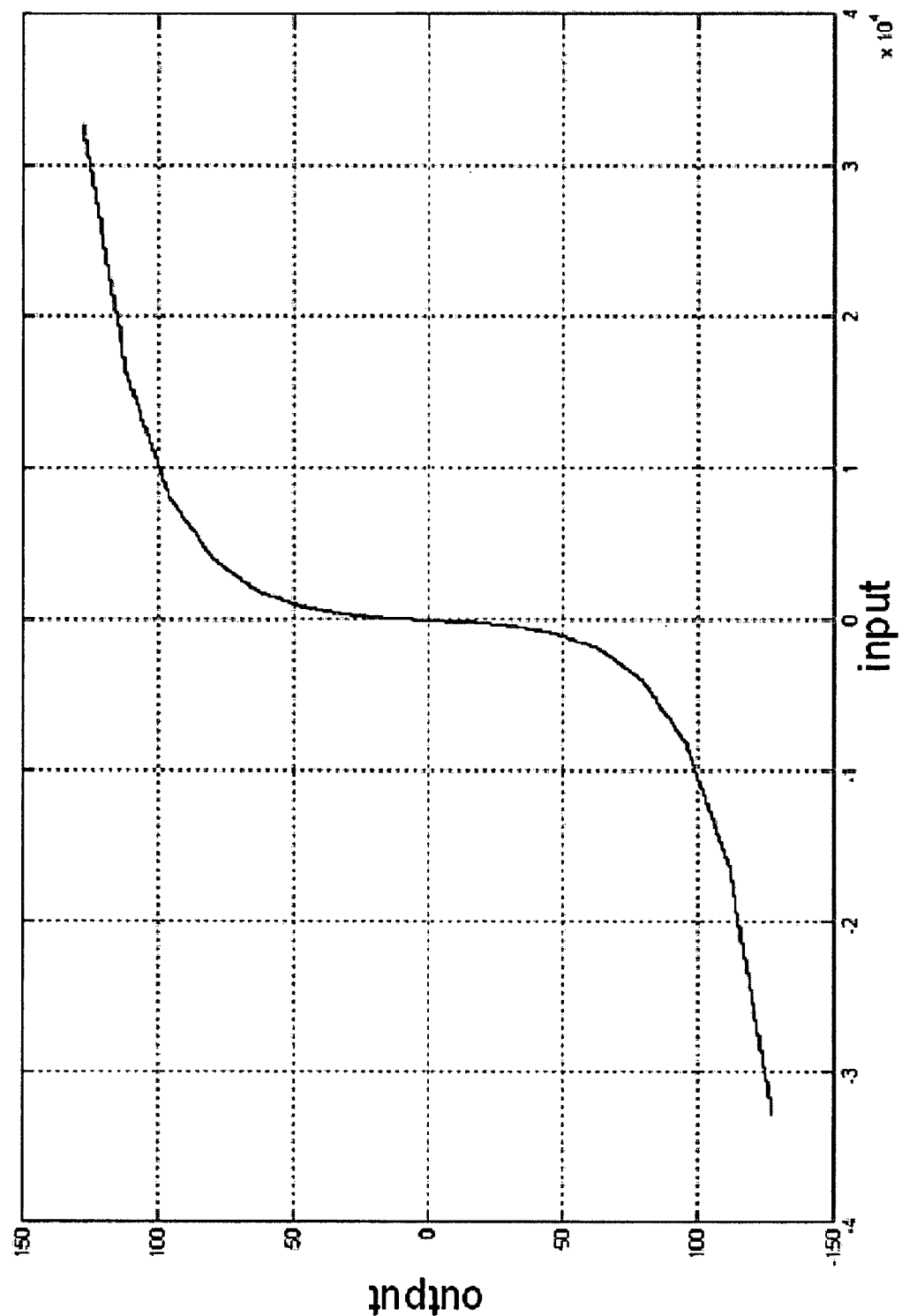
FIG. 19 is a graphical representation of a piecewise linear approximation to the compression characteristic used in some embodiments of the disclosed subject matter.
Figure 20:
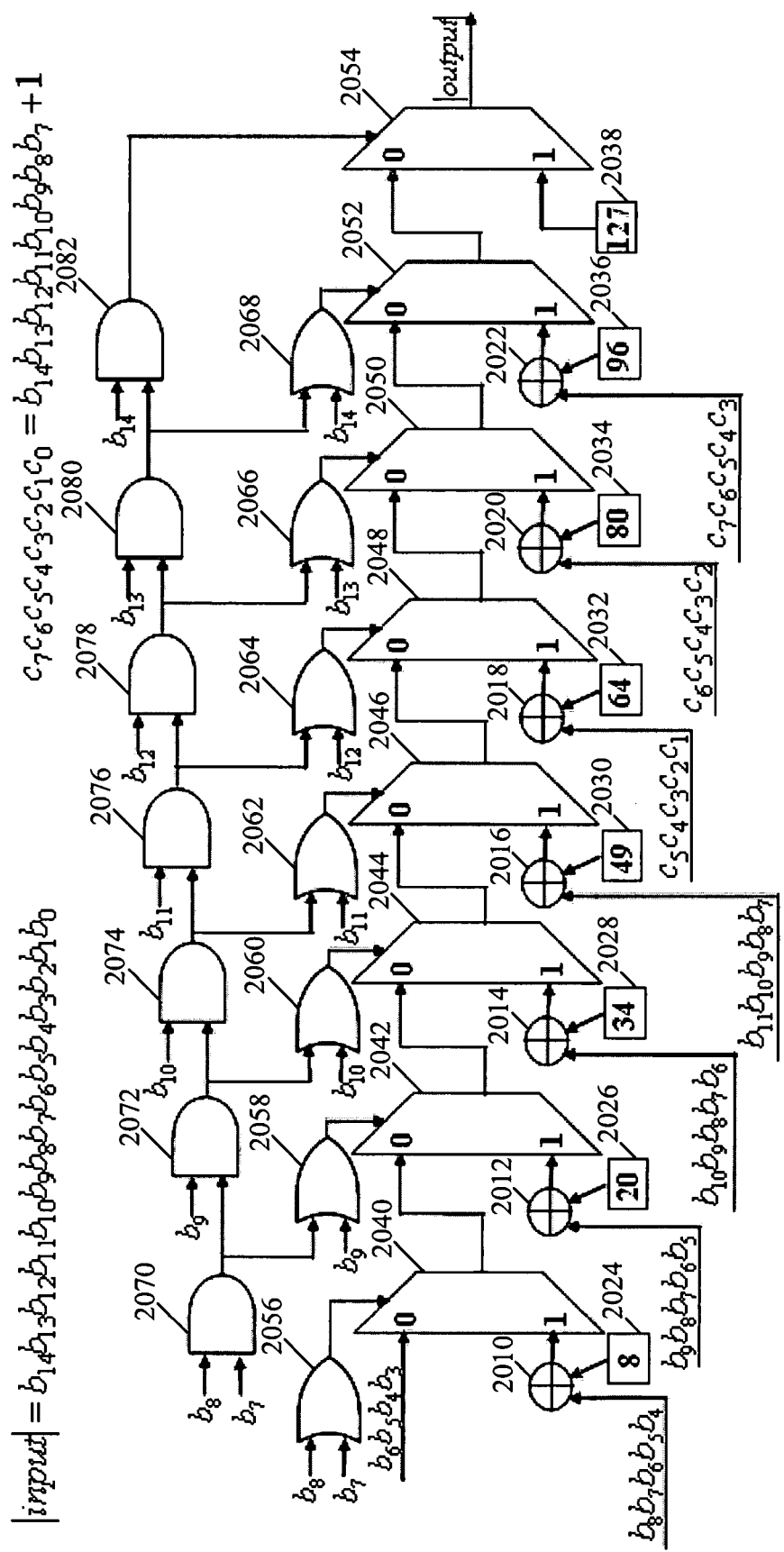
FIG. 20 is a block diagram of a circuit used for signal compression in accordance with certain embodiments of the disclosed subject matter.

In certain embodiments, the nonlinear compressing and expanding functions can be implemented using a piecewise linear approximation to the 255-mu law, where the slope in each line segment is an integer power of 2. This approximation is shown in FIG. 19. A compressor circuit using the 255-mu law piecewise linear approximation is shown in FIG. 20, in accordance with some embodiments. In some embodiments, the compressing function is chosen to be odd, as in FIG. 19. If the compressing function is odd, the circuit in FIG. 20 operates on the absolute value of the input, and the output of this circuit is multiplied by −1 if the input is negative. The particular circuit of FIG. 20 is designed for a 16 bit binary (base 2) input, so the absolute value of the input is 15 bits. The individual input bits shown in FIG. 20 range from the most significant bit (MSB), $b_{14}$, to the least significant bit (LSB), $b_0$. The c bits are derived from the b input bits as shown in FIG. 20. The circuit of FIG. 20 includes adders 2010 to 2022, scalar values 2024 to 2038, MUXs 2040 to 2054, or-gates 2056 to 2068, as well as and-gates 2070 to 2082. Since the characteristic of FIG. 19 is piecewise linear, and the slopes in each line segment are integer powers of 2, the characteristic can be implemented in a circuit by finding the segment in which the input falls, and then adding an appropriately shifted input to an appropriate constant. The output corresponding to each segment is obtained by adding a specific bit slice of the input (which corresponds to a shift) to an appropriate constant. Or-gates 2056 to 2068 as well as and-gates 2070 to 2082 are used to figure out which segment the input falls in, and MUXs 2040 to 2054 are used to obtain the output corresponding to that segment.

Figure 21:
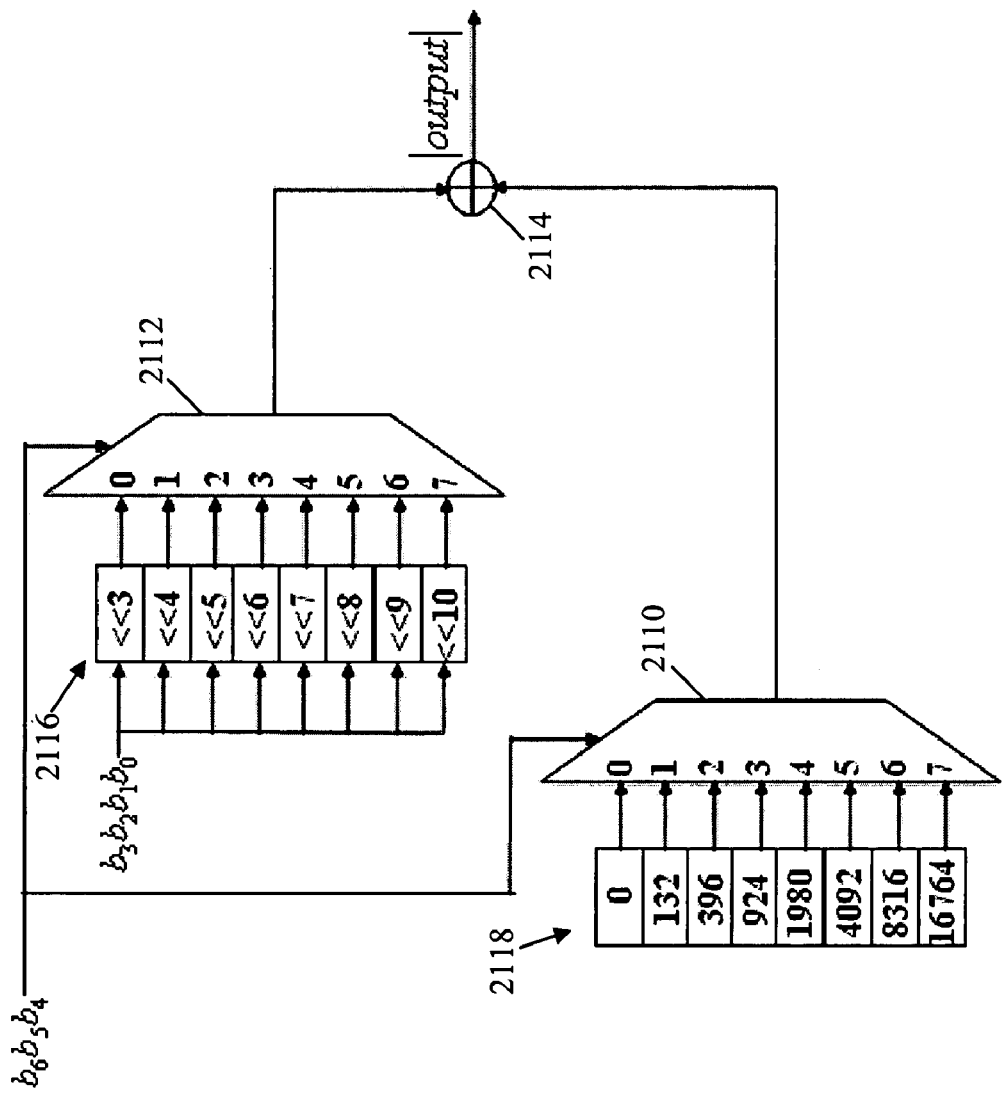
FIG. 21 is a block diagram of a circuit for implementing the corresponding expansion characteristic in accordance with certain embodiments of the disclosed subject matter.

FIG. 21 illustrates an expander circuit in accordance with certain embodiments of the disclosed subject matter. The expander circuit includes MUXs 2110 and 2112, an adder 2114, shifters 2116, and scalar values 2118. For the expander circuit, the circuit is designed for an 8 bit input, and like the compressor circuit, the expander circuit operates on the absolute value of the input, which is 7 bits. As was the case in FIG. 20, the output corresponding to each segment is obtained by adding an appropriately shifted input to an appropriate constant, and MUXs 2110 and 2112 are used to select the output corresponding to the actual segment in which the input falls and the three most significant bits control the shift amount and the constant.

In some embodiments, the companding system may consist of a cascade of companding DSP circuits. Because the output of each of the companding states is properly companded, the output may be passed directly to the next companding stage without modification. In certain embodiments further simplification is available. For example, if the output of the $i^{th}$ stage is multiplied by a coefficient of 1 in the expander then the result can be passed to the $(i+1)^{th}$ stage directly, saving an application of g(v) followed by $g^{-1}(v)$. In some embodiments, when the coefficient is not 1, code implementing a 2N-bit multiplication using allowed N-bit operations on a DSP may be written instead of using an application of g(v) followed by $g^{-1}(v)$.

Figure 16:
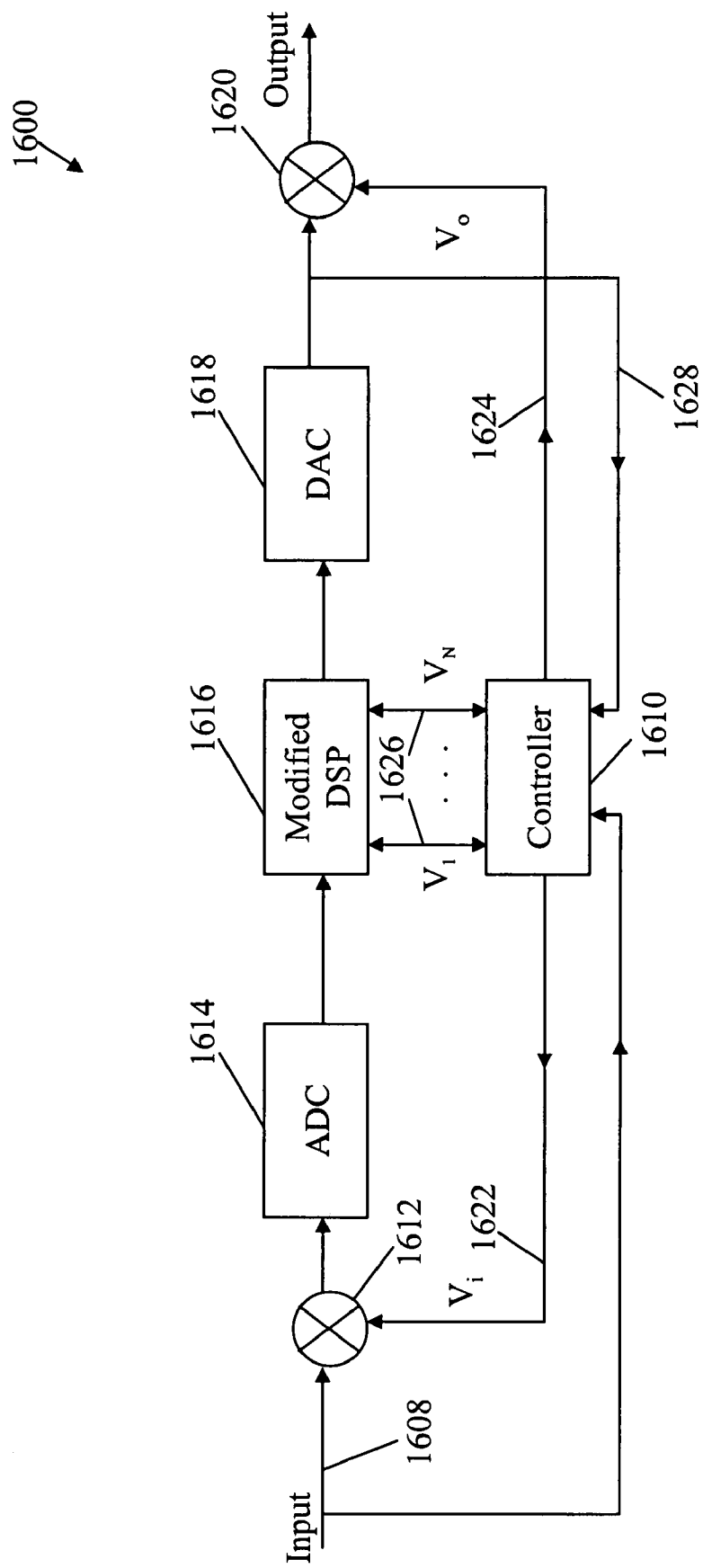
FIG. 16 is a schematic of a general function companding system with a controller in accordance with certain embodiments of the disclosed subject matter.

FIG. 16 illustrates a controller-based general function companding system 1600 in accordance with certain embodiments of the disclosed subject matter. Companding system 1600 includes an input signal 1608, a controller 1610, an input multiplier 1612, an ADC 1614, a modified DSP 1616, a DAC 1618, a multiplier 1620, a general function signal 1622, an inverse general function signal 1624, input/output signals 1626, and a digital signal 1628. Controller 1610 uses input 1608 along with a lookup table to select or other specialized hardware to produce a general function signal to modify input signal 1608 at multiplier 1612. A similar process occurs with multiplier 1620, where digital signal 1628 is used to select or to produce an inverse general function signal 1624, which may also include a gain component. Modified DSP 1616 uses input/output signals 1626 to select or to produce the necessary nonlinear companding modifications for its internal signals.

An example of another implementation of the disclosed subject matter using instantaneous companding is shown using simple reverberator 1200 of FIG. 12. Applying equations 9 to simple reverberator 1200 the following is obtained:

$$\hat{x}_1(n+1)=g(-0.8g^{-1}(\hat{x}_k(n))+0.2g^{-1}(\hat{u}(n)))$$

$$\hat{x}_i(n+1)=\hat{x}_{i-1}(n), 2 \leq i \leq k$$

$$\hat{y}(n)=g(1.8g^{-1}(\hat{x}_k(n))+0.8g^{-1}(\hat{u}(n))) \qquad \text{Equations 10}$$

As seen above in the earlier examples, the second equation of equations 10 illustrates that for k−1 of the internal DSP states, no applications of g(v) may be necessary. This is expected for a k-delay block provided that the general functions corresponding to the states of the k-delay block have the same functional form (e.g., the μ law function is used for each of the k states). This provides intuitive justification for using the same functional form for all the states of a k-delay block, since if the input to a k-delay block is properly companded, then all the internal states of this block are also be properly companded, so no applications of nonlinear functions should be necessary for k−1 of these states.

The α coefficients used for the inverse operation are determined from equations 10. Because four different coefficients appear, namely 0.8, −0.8, 0.2, and 1.8, four a $g^{-1}(v)$ lookup tables may be used to implement the companding system. The number of lookup tables may be reduced, though, by modifying the system equation recognizing that 1.8=1+0.8 and 0.2=1−0.8, and using 2N-bit subtraction. The following equivalent system results:

$$\hat{x}_1(n+1)=g(g^{-1}(\hat{u}(n))-0.8g^{-1}(\hat{u}(n))-0.8g^{-1}(\hat{x}_k(n)))$$

$$\hat{x}_i(n+1)=\hat{x}_{i-1}(n), 2 \leq i \leq k$$

$$\hat{y}(n)=g(g^{-1}(\hat{x}_k(n))+0.8g^{-1}(\hat{x}_k(n))+0.8g^{-1}(\hat{u}(n)))$$ Equations 11

Thus, only two lookup tables are necessary: one for $g^{-1}(v)$ and one for $0.8\,g^{-1}(v)$. This type of system equation modification may be applicable for most systems because parameters are generally closely related due to the system topologies typically used in applications.

Figure 17:
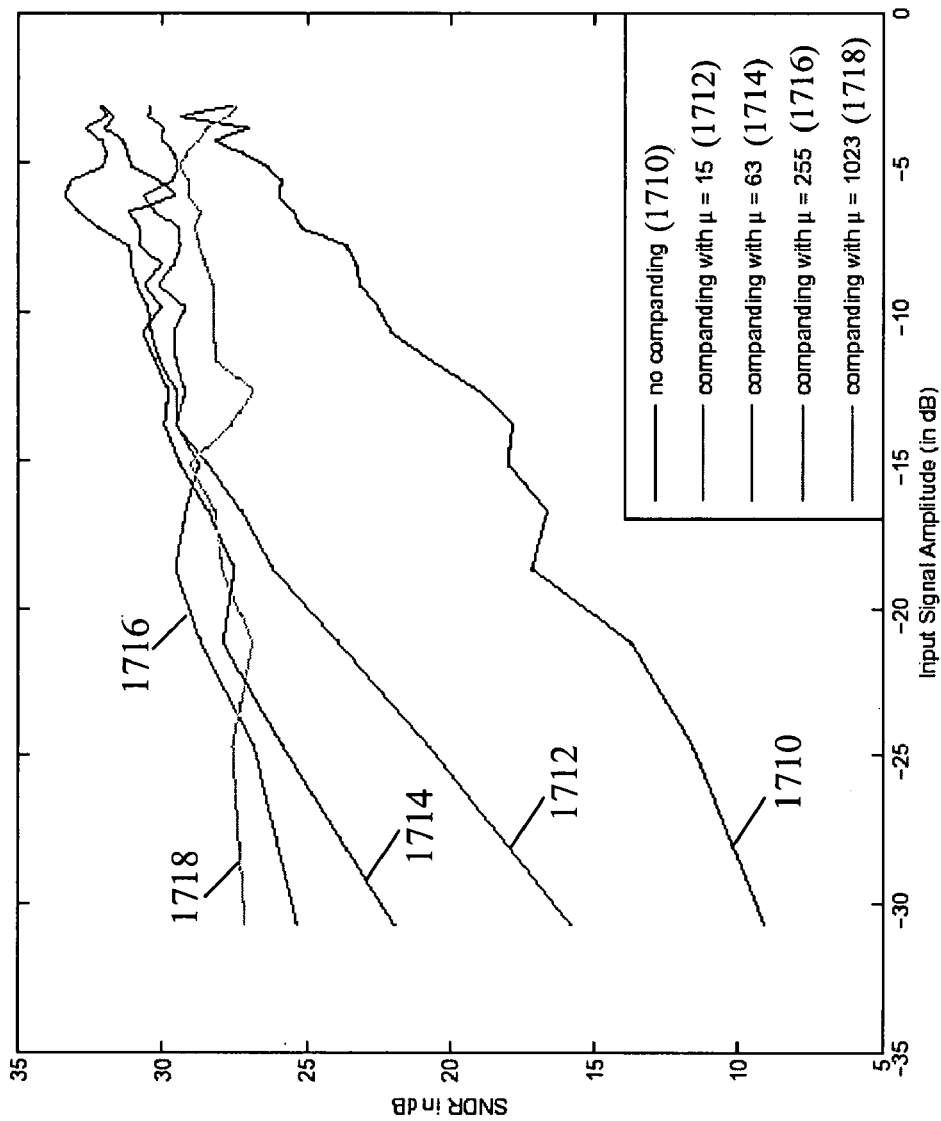
FIG. 17 is a graphical representation of signal-to-noise-plus-distortion ratios for processing with instantaneous companding versus without companding in accordance with certain embodiments of the disclosed subject matter.

This example reverberator system was simulated in a cascade of two stages, each of them being a simple reverberator 1200 of FIG. 12. The simulated system was run at a sampling rate of 44.1 kHz, and the equations for each stage of the companding system were given by equations 11, with k=2000 for the first stage and k=4410 for the second stage. In addition, g(v) and $g^{-1}(v)$ were given by equations 7 and 8, and because one of the coefficients is 1 that coefficient may be passed directly between the cascaded stages eliminating certain processing requirements. Some simulation results are illustrated for a sinusoidal input signal in FIG. 17 including a no companding line 1710, a companding with μ=15 line 1712, a companding with μ=63 line 1714, a companding with μ=255 line 1716, and a companding with μ=1023 line 1718. As illustrated, the SNDR for the non-companding system varies in proportion to the input signal, whereas the SNDR of the companding systems (such as μ=63 and greater) stays relatively constant over the range of input values shown.

The instantaneous companding described above can also be implemented by combining the instantaneous companding with standard linear scaling techniques already used in fixed-point DSPs. Specifically, if based on applying linear scaling techniques to the prototype DSP, there is a desire to scale a particular state, x(n), by a constant factor of a, then instead of setting $\hat{x}(n)=g(x(n))$, $\hat{x}(n)=g(ax(n))$ can be set. By then working through algebra similar to that described above, a system that provides both linear scaling and instantaneous companding can be obtained, in some embodiments.

Figure 22:
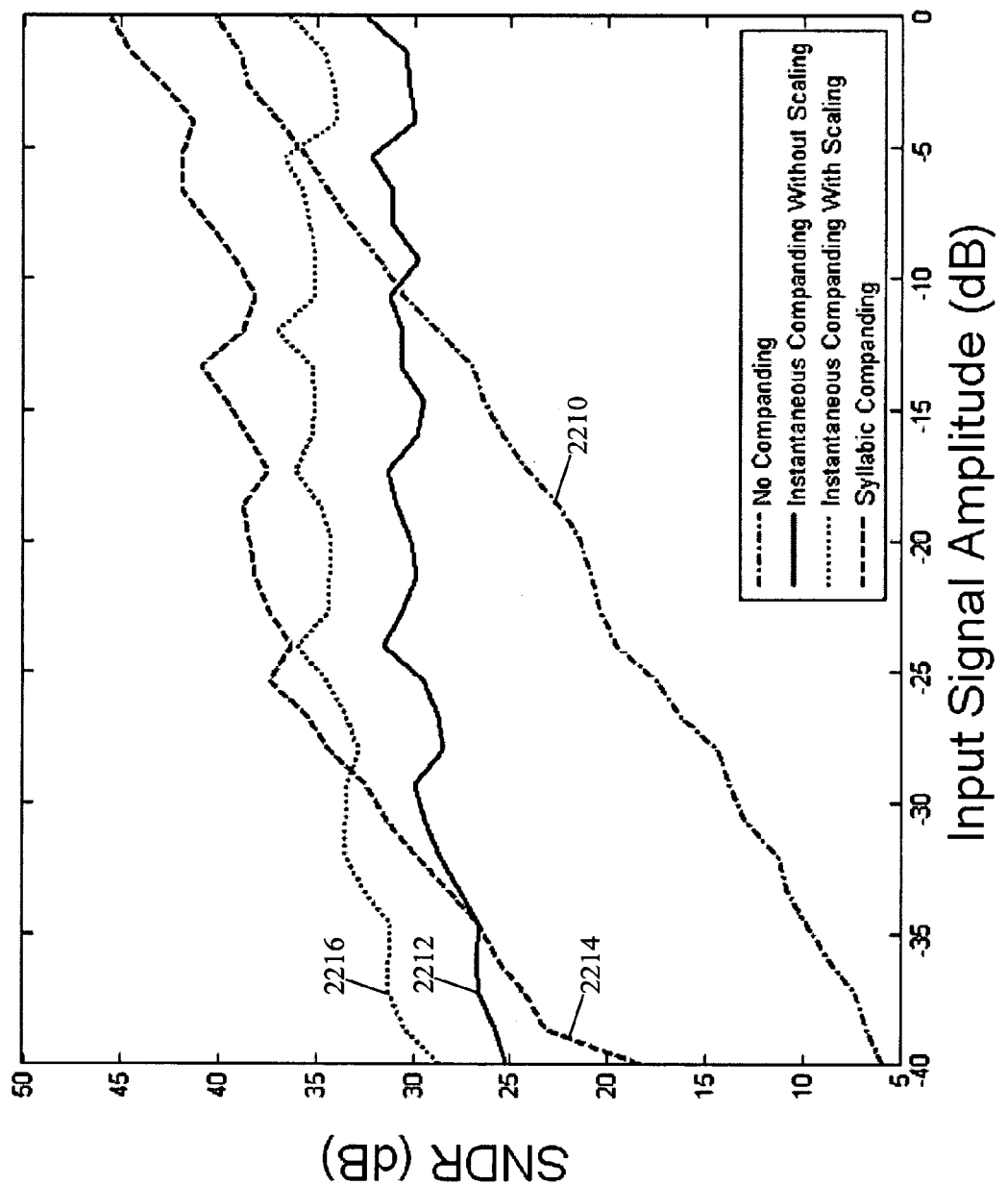
FIG. 22 shows measured results from hardware implementations of certain embodiments of the disclosed subject matter.

Experimental results of both syllabic companding and instantaneous companding variations of the disclosed subject matter implemented on field programmable gate array (FPGA) hardware are provided. Some typical measured signal to noise ratios from the FPGA hardware implementations are shown in FIG. 22, in accordance with certain embodiments. Results from performing no companding on a signal are shown by line 2210, instantaneous companding without scaling by line 2212, instantaneous companding with scaling by line 2214, and syllabic companding by line 2216.

The above schemes increase the performance of fixed-point DSPs through the use of companding, so that the DSPs suffer less from rounding noise when the signal envelope is small, and from clipping when the signal envelope is large. Introducing the disclosed subject matter into various signal-processing applications, instead of floating-point DSPs, may result in lower power consumption, smaller device size, and lower-cost devices.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

We claim:

1. A system for signal processing that receives an input signal comprising:
   an input multiplier, having a first input coupled to the input signal, second input and an output;
   an analog-to-digital converter (ADC), having an input that is coupled to the output of the input multiplier, and an output;
   a digital signal processor (DSP), having a first input that is coupled to the output of the ADC, a second input, and an output;
   a digital-to-analog converter (DAC), having an input coupled to the output of the DSP, and an output;
   an output multiplier, having a first input coupled to the output of the DAC, a second input, and an output; and
   a controller, having an input that receives the input signal, a first output that is coupled to the second input of input multiplier, a second output that is coupled to the second input of output multiplier, and a third output coupled the second input of the DSP,
   wherein the input signal is resized by the input multiplier.

2. The system of claim 1, further comprising an optional delay placed before the input multiplier.

3. The system of claim 1, wherein the controller implements companding to resize the input signal.

4. The system of claim 1, wherein the controller sends information to the DSP to implement digital companding.

5. The system of claim 4, wherein the DSP implements digital companding to counter time-varying distortion.

6. A system for signal processing that receives an input signal comprising:
   a first means for multiplying, having a first input coupled to the input signal, second input and an output;
   a means for providing an analog-to-digital converter (ADC), having an input that is coupled to the output of the first means, and an output;
   a means for providing digital signal processor (DSP), having a first input that is coupled to the output of the means for providing an ADC, a second input, and an output;
   a means for providing a digital-to-analog converter (DAC), having an input coupled to the output of the means for providing a DSP, and an output;
   a second means for multiplying, having a first input coupled to the output of the means for providing a DAC, a second input, and an output; and
   a means for controlling, having an input that receives the input signal, a first output that is coupled to the second input of the first means, a second output that is coupled to the second input of the second means, and a third output coupled the second input of the means for providing a DSP,
   wherein the input signal is resized by the first means.

7. The system of claim 6, further comprising an optional means for providing delay placed before the first means.

8. The system of claim 6, wherein the means for controlling implements companding to resize the input signal.

9. The system of claim 6, wherein the means for controlling sends information to the means for providing a DSP implement digital companding.

10. The system of claim 9, wherein the means for providing a DSP implements digital companding to counter time-varying distortion.

11. A method for processing an analog input signal with fixed-point devices comprising:
   resizing the analog input signal based on information provided by a controller;
   converting the resized analog input signal to a digital signal;
   processing the digital signal based in part on information provided by the controller;
   converting the processed digital signal to an analog signal; and
   resizing the analog signal.

12. The method of claim 11, further comprising delaying the input signal before resizing the analog input signal.

13. The method of claim 11, further comprising sending information for implementing digital companding when processing a digital signal.

14. The method of claim 13, wherein digital companding is implemented to counter time-varying distortion.

15. The method of claim 14, further comprising storing base 2 logs of variables and performing subtractions and shifts on the base 2 logs of variables.

16. The method of claim 11, wherein the controller uses one or more lookup tables to implement a function.

17. The method of claim 16, wherein the resizing of the analog signal is implemented using one or more lookup tables.

18. A system for signal processing that receives an input signal comprising:
   a compressor, having an input coupled to the input signal, and an output;
   a nonlinear digital signal processor (DSP), having an input that is coupled to the output of the compressor, and an output, wherein the nonlinear DSP implements linear scaling and the input signal undergoes instantaneous companding; and
   an expander, having an input coupled to the output of the DSP,
   wherein the input signal is resized by the compressor according to a function.

19. The system of claim 18, wherein the compressor receives multiple signals at a corresponding number of inputs.

20. The system of claim 18, wherein the compressor and the expander implement the resizing according to a function implemented in a lookup table.

21. The system of claim 18, wherein a lookup table is used in the DSP to make the DSP nonlinear.

22. A system for signal processing that receives an input signal comprising:
   a compressor, having an input coupled to the input signal, and an output;
   an analog-to-digital converter (ADC), having an input coupled to the output of the compressor, and an output;
   a nonlinear digital signal processor (DSP), having an input that is coupled to the output of the ADC, and an output;
   a digital-to-analog converter (DAC), having an input coupled to the output of the DSP, and an output; and
   an expander, having an input coupled to the output of the DAC,
   wherein the input signal is resized by the compressor according to a function.

23. A system for signal processing that receives an input signal comprising:
   a compressor, having an input coupled to the input signal, and an output;
   a nonlinear digital signal processor (DSP), having an input that is coupled to the output of the compressor, and an output; and
   an expander, having an input coupled to the output of the DSP,
   wherein the input signal is resized by the compressor according to a function, and wherein the compressor and the expander are implemented using nonlinear functions that are piecewise linear approximations.

* * * * *